US012731763B2

(12) United States Patent
Katsunuma et al.

(10) Patent No.: US 12,731,763 B2
(45) Date of Patent: Sep. 8, 2026

(54) PLASMA PROCESSING SYSTEM, ASSISTANCE DEVICE, ASSISTANCE METHOD, AND ASSISTANCE PROGRAM

(71) Applicant: Tokyo Electron Limited, Tokyo (JP)

(72) Inventors: Takayuki Katsunuma, Miyagi (JP); Masanobu Honda, Miyagi (JP); Tetsuya Nishizuka, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 45 days.

(21) Appl. No.: 19/012,955

(22) Filed: Jan. 8, 2025

(65) Prior Publication Data

US 2025/0149299 A1 May 8, 2025

Related U.S. Application Data

(63) Continuation of application No. PCT/JP2023/024813, filed on Jul. 4, 2023.

(30) Foreign Application Priority Data

Jul. 15, 2022 (JP) ................................ 2022-113776

(51) Int. Cl.
*H01J 37/32* (2006.01)

(52) U.S. Cl.
CPC .. *H01J 37/32174* (2013.01); *H01J 37/32449* (2013.01); *H01J 37/32477* (2013.01);
(Continued)

(58) Field of Classification Search
CPC .......... H01J 37/32174; H01J 37/32449; H01J 37/32477; H01J 37/32522;
(Continued)

(56) References Cited

U.S. PATENT DOCUMENTS

2006/0021580 A1* 2/2006 Hirano .............. H01J 37/32082 118/722
2022/0035979 A1 2/2022 Moffatt et al.

FOREIGN PATENT DOCUMENTS

JP 2019-133785 A 8/2019
JP 2019-537240 A 12/2019
(Continued)

OTHER PUBLICATIONS

International Search Report and Written Opinion mailed on Sep. 12, 2023, received for PCT Application PCT/JP2023/024813, filed on Jul. 4, 2023, 9 pages including English Translation.

*Primary Examiner* — Daniel D Chang
(74) *Attorney, Agent, or Firm* — XSENSUS LLP

(57) ABSTRACT

The plasma processing system includes a plasma processing device, an assistance device, and a control device, in which the assistance device includes a first determination unit for determining, using a first machine learning model, a plurality of control parameters for processing a pre-processing substrate so that a predicted shape of the post-processing substrate conforms a required shape of the post-processing substrate based on a first input related to a structure of the pre-processing substrate, a second input related to a required shape of the post-processing substrate, a third input related to a specification of the plasma processing device, and a fourth input related to a state of the plasma processing device, and a second determination unit for determining an operating condition of the plasma processing device using a second machine learning model, based on the plurality of determined control parameters, the third input, and the fourth input.

20 Claims, 23 Drawing Sheets

(52) U.S. Cl.
CPC .. *H01J 37/32522* (2013.01); *H01J 37/32862* (2013.01); *H01J 2237/24592* (2013.01); *H01J 2237/3348* (2013.01)

(58) Field of Classification Search
CPC ....... H01J 37/32862; H01J 2237/24592; H01J 2237/3348; H01J 37/32926; H01J 37/3299; H01J 37/32935; H10P 50/242; H10P 95/00; H05H 1/46; G06N 20/00
See application file for complete search history.

(56) References Cited

FOREIGN PATENT DOCUMENTS

| | | | | |
|---|---|---|---|---|
| JP | 2020-031096 | A | 2/2020 | |
| JP | 2020-070470 | A | 5/2020 | |
| JP | 2021-086572 | A | 6/2021 | |
| JP | 2022-042979 | A | 3/2022 | |
| WO | WO-2021081213 | A1 * | 4/2021 | .......... H10W 20/056 |

* cited by examiner 100
110
SERVER DEVICE
130
MANAGEMENT DEVICE
120
PRE-PROCESSING SUBSTRATE
PLASMA PROCESSING DEVICE
POST-PROCESSING SUBSTRATE
EXPERIMENTAL PROCESS
140
PRE-PROCESSING SUBSTRATE
PLASMA PROCESSING DEVICE
POST-PROCESSING SUBSTRATE
MANUFACTURING PROCESS

FIG. 3

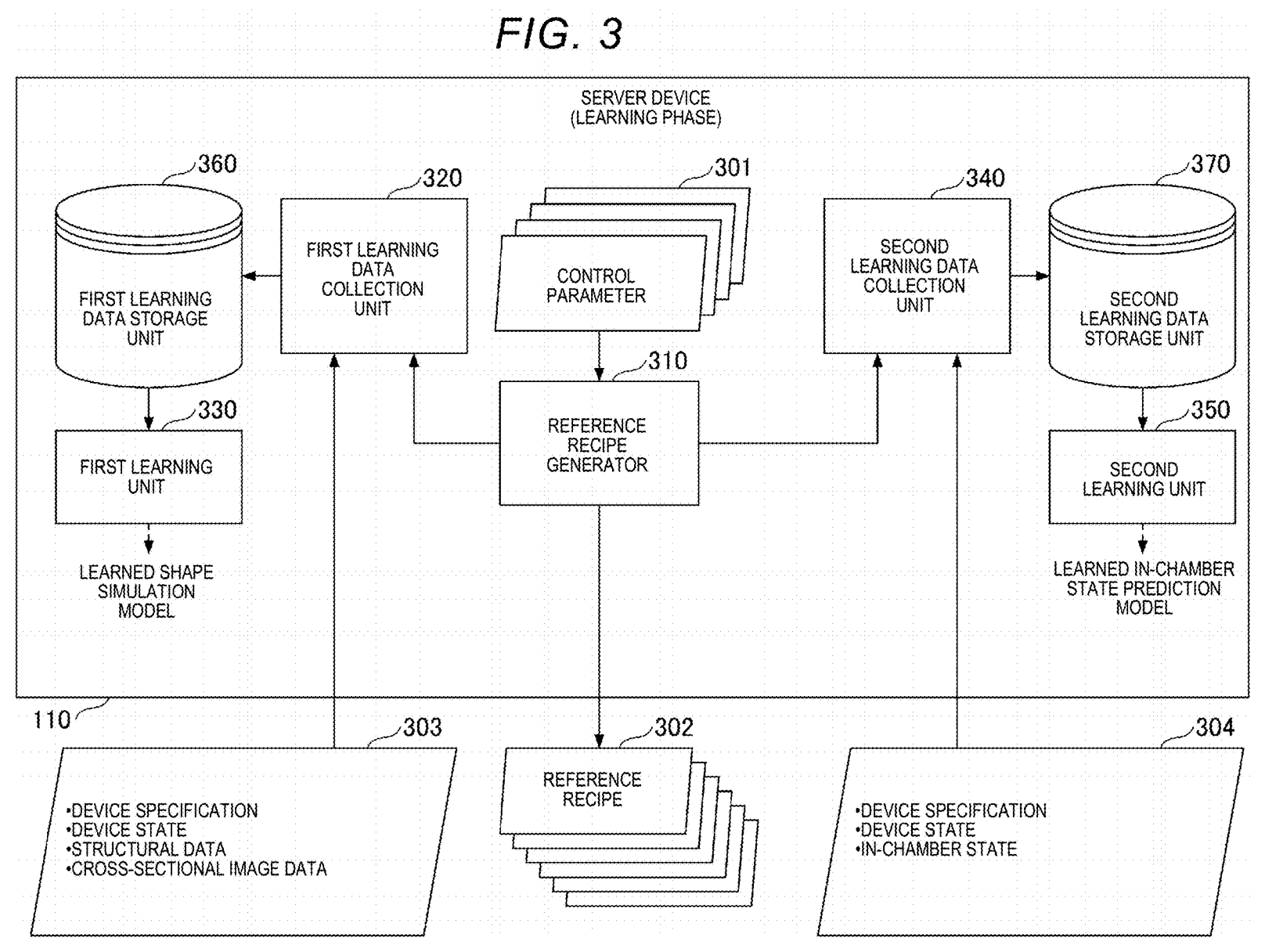

SERVER DEVICE
(LEARNING PHASE)

110

301 CONTROL PARAMETER

310 REFERENCE RECIPE GENERATOR

302 REFERENCE RECIPE

320 FIRST LEARNING DATA COLLECTION UNIT

360 FIRST LEARNING DATA STORAGE UNIT

330 FIRST LEARNING UNIT

LEARNED SHAPE SIMULATION MODEL

340 SECOND LEARNING DATA COLLECTION UNIT

370 SECOND LEARNING DATA STORAGE UNIT

350 SECOND LEARNING UNIT

LEARNED IN-CHAMBER STATE PREDICTION MODEL

303
- DEVICE SPECIFICATION
- DEVICE STATE
- STRUCTURAL DATA
- CROSS-SECTIONAL IMAGE DATA

304
- DEVICE SPECIFICATION
- DEVICE STATE
- IN-CHAMBER STATE

| LIST OF CONTROL PARAMETERS | | |
|---|---|---|
| CONTROL PARAMETER | TEMPORAL CHANGE | PHYSICAL QUANTITY BEING CONTROLLED |
| RF SIGNAL (HF/LF) | HF<br>LF | •ION/ELECTRON DENSITY<br>•RADICAL DENSITY, COMPOSITION<br>•ION ANGLE DISTRIBUTION, ION ENERGY |
| PROCESSING GAS (GAS TYPE, FLOW RATE) | FLOW RATE | •FORMATION OF PROTECTIVE FILM OF INNER WALL OF PLASMA PROCESSING CHAMBER<br>•RADICAL DENSITY•COMPOSITION |
| ESC TEMPERATURE | | •REACTION SPEED<br>•RADICAL ADHESION COEFFICIENT |
| IN-CHAMBER PRESSURE | | •ION ANGLE DISTRIBUTION<br>•RADICAL/ION RATIO<br>•RADICAL COMPOSITION |

REFERENCE RECIPE 3

REFERENCE RECIPE 2

REFERENCE RECIPE 1

| CONTROL PARAMETER | | STEP 1 | STEP 2 | STEP 3 | STEP 4 | STEP 5 | STEP 6 | STEP 7 | STEP 8 | STEP 9 |
|---|---|---|---|---|---|---|---|---|---|---|
| RF SIGNAL | HF | HIGH | MEDIUM | LOW | MEDIUM | LOW | MEDIUM | LOW | MEDIUM | LOW |
| | LF | LOW | – | MEDIUM | – | HIGH | – | HIGH | – | HIGH |
| PROCESSING GAS | GAS TYPE | A/B/C | B/D | B/C/E | F/G | A/C/E | A/D | B/C/E | B | C/E/F/G |
| | FLOW RATE | $\alpha / \beta / \gamma$ | $\delta / \varepsilon$ | $\zeta / \eta / \theta$ | $\kappa / \lambda$ | $\mu / \nu / \xi$ | $o / \pi$ | $\rho / \sigma / \tau$ | $\upsilon$ | $\phi / \chi / \psi / \omega$ |
| ESC TEMPERATURE | | MEDIUM | LOW | LOW | HIGH | LOW | LOW | LOW | HIGH | LOW |
| IN-CHAMBER PRESSURE | | MEDIUM | HIGH | LOW | HIGH | LOW | HIGH | MEDIUM | HIGH | HIGH |

| FIRST LEARNING DATA (INPUT DATA) | |
|---|---|
| DEVICE SPECIFICATION | DEVICE I |
| DEVICE STATE | RF INTEGRATION TIME α |
| STRUCTURAL DATA | PATTERN a |
| | MASK MATERIAL M1 |
| | ETCHED FILM MATERIAL E1 |
| | ADI CD DIMENSIONS |
| | FILM THICKNESS T1 |
| | OPENING RATE A1 |
| CROSS-SECTIONAL IMAGE DATA | |
| RECIPE | REFERENCE RECIPE 1 |

720

FIRST LEARNING DATA (CORRECT DATA)

| STEP 1 | STEP 2 | STEP 3 | STEP 4 |
|---|---|---|---|
| STEP 5 | STEP 6 | STEP 7 | STEP 8 |
| STEP 9 | | | |

FIRST LEARNING DATA (INPUT DATA)
710
DEVICE SPECIFICATION
DEVICE STATE
STRUCTURAL DATA
CROSS-SECTIONAL IMAGE DATA
RECIPE
FIRST LEARNING DATA (CORRECT DATA)
720
STEP 1
STEP 2
STEP 3
STEP 4
STEP 5
STEP 6
STEP 7
STEP 8
STEP 9
330
FIRST LEARNING UNIT
810
INPUT UNIT
820
SHAPE SIMULATION MODEL
830
COMPARISON/ CHANGING UNIT

Figure 9:
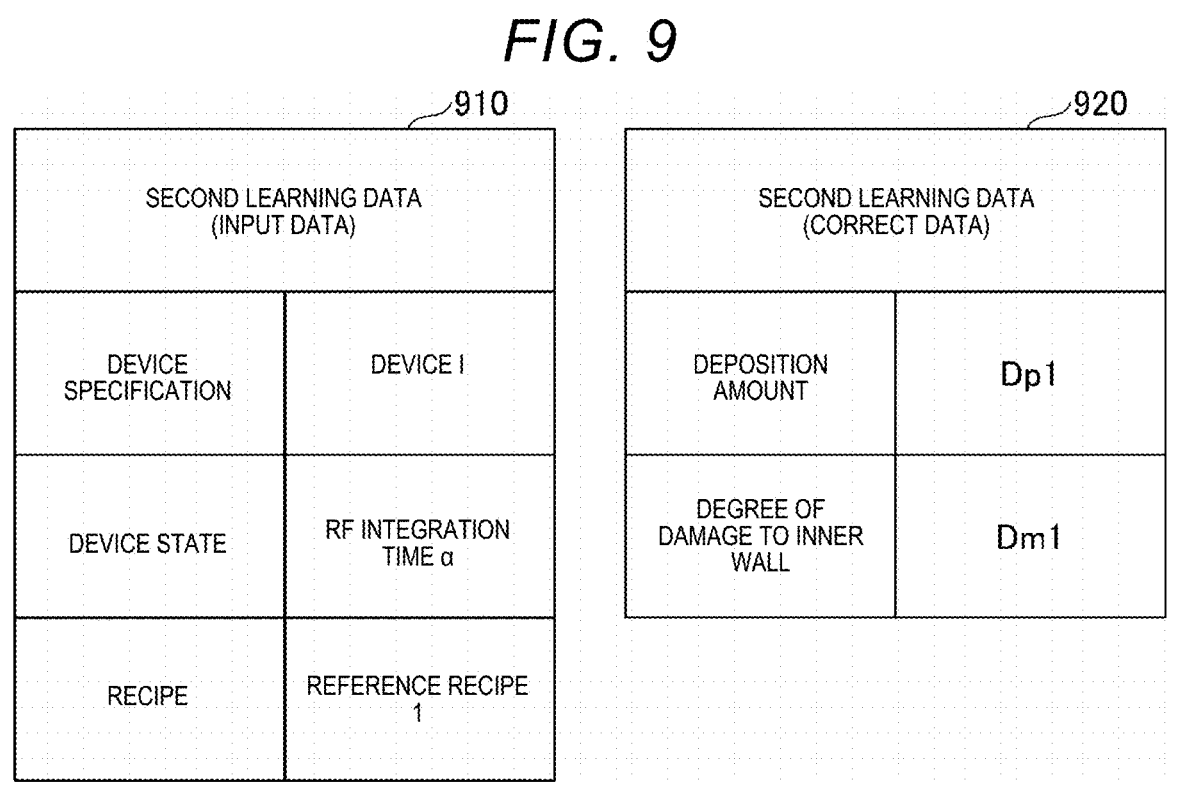

| SECOND LEARNING DATA (INPUT DATA) | |
|---|---|
| DEVICE SPECIFICATION | DEVICE I |
| DEVICE STATE | RF INTEGRATION TIME α |
| RECIPE | REFERENCE RECIPE 1 |

920

| SECOND LEARNING DATA (CORRECT DATA) | |
|---|---|
| DEPOSITION AMOUNT | Dp1 |
| DEGREE OF DAMAGE TO INNER WALL | Dm1 |

910
SECOND LEARNING DATA (INPUT DATA)
DEVICE SPECIFICATION
DEVICE STATE
RECIPE
920
SECOND LEARNING DATA (CORRECT DATA)
DEPOSITION AMOUNT
DEGREE OF DAMAGE TO INNER WALL
350
SECOND LEARNING UNIT
1010
INPUT UNIT
1020
IN-CHAMBER STATE PREDICTION MODEL
1030
COMPARISON/ CHANGING UNIT 100
110
SERVER DEVICE
130
MANAGEMENT DEVICE
120
PRE-PROCESSING SUBSTRATE
PLASMA PROCESSING DEVICE
POST-PROCESSING SUBSTRATE
EXPERIMENTAL PROCESS
140
PRE-PROCESSING SUBSTRATE
PLASMA PROCESSING DEVICE
POST-PROCESSING SUBSTRATE
MANUFACTURING PROCESS

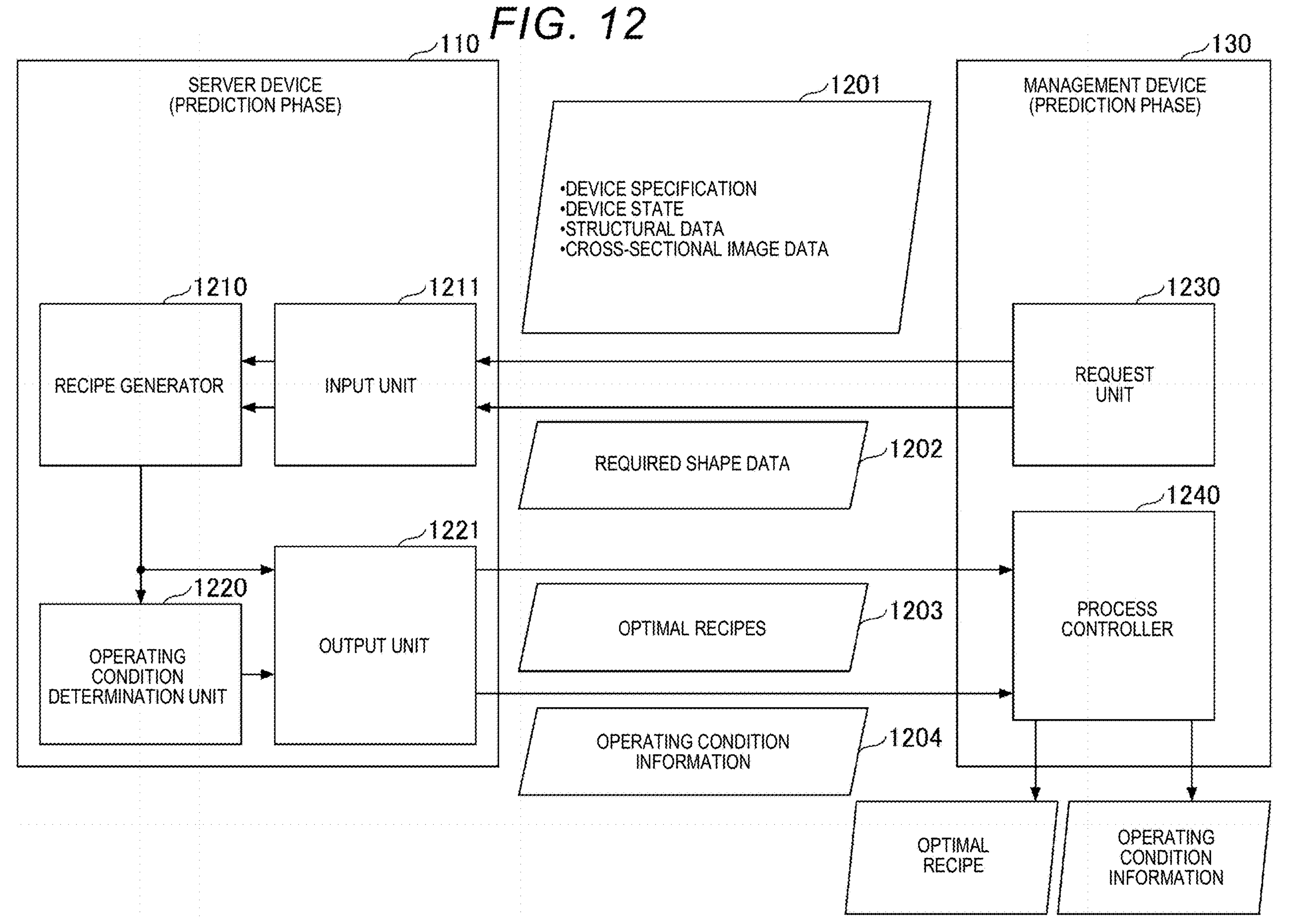
FIG. 12
110
SERVER DEVICE (PREDICTION PHASE)
1210
RECIPE GENERATOR
1211
INPUT UNIT
1221
OUTPUT UNIT
1220
OPERATING CONDITION DETERMINATION UNIT
1201
•DEVICE SPECIFICATION
•DEVICE STATE
•STRUCTURAL DATA
•CROSS-SECTIONAL IMAGE DATA
1202
REQUIRED SHAPE DATA
1203
OPTIMAL RECIPES
1204
OPERATING CONDITION INFORMATION
130
MANAGEMENT DEVICE (PREDICTION PHASE)
1230
REQUEST UNIT
1240
PROCESS CONTROLLER
OPTIMAL RECIPE
OPERATING CONDITION INFORMATION

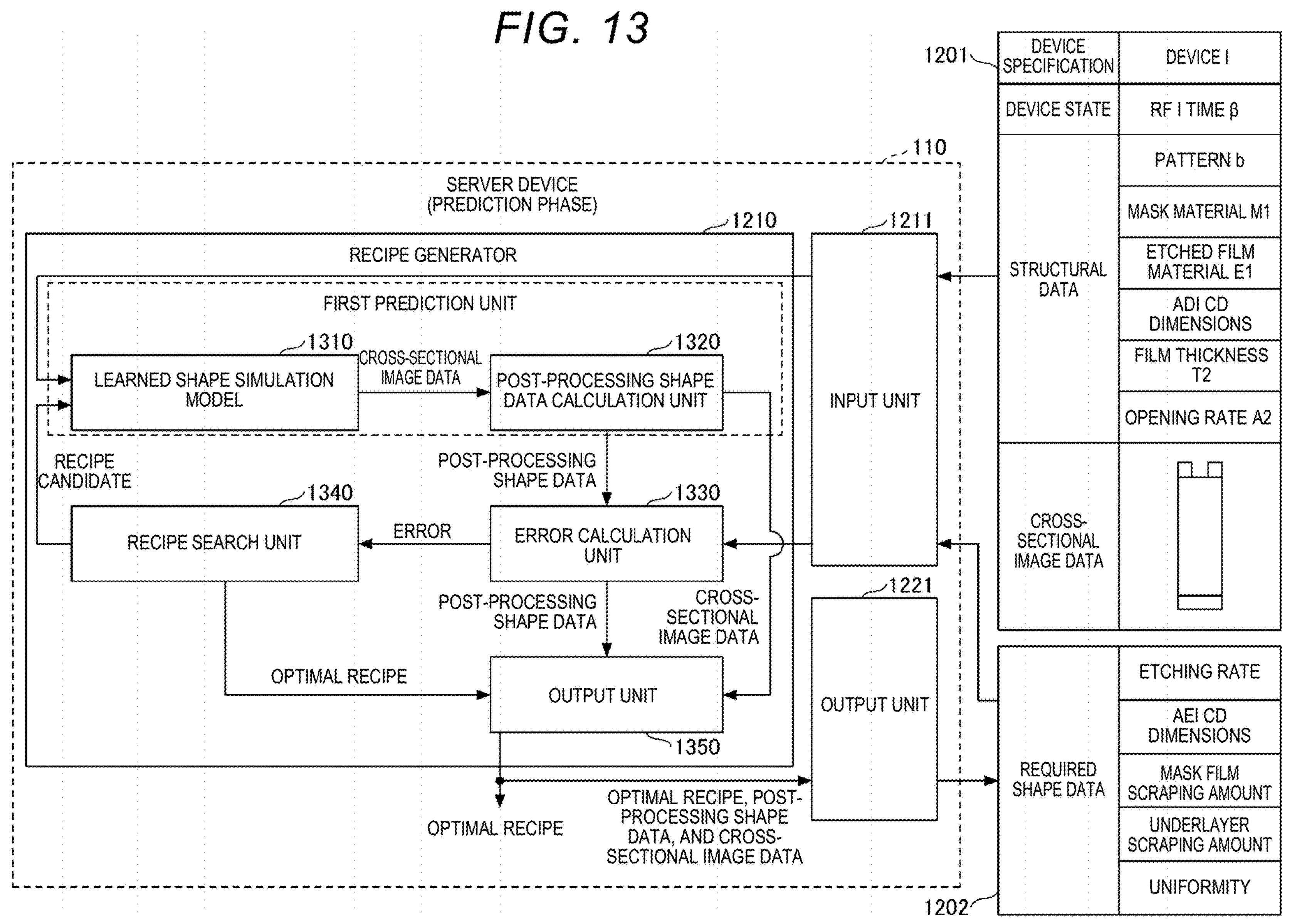
FIG. 13
1201
DEVICE SPECIFICATION
DEVICE I
DEVICE STATE
RF I TIME β
STRUCTURAL DATA
PATTERN b
MASK MATERIAL M1
ETCHED FILM MATERIAL E1
ADI CD DIMENSIONS
FILM THICKNESS T2
OPENING RATE A2
CROSS-SECTIONAL IMAGE DATA
1202
REQUIRED SHAPE DATA
ETCHING RATE
AEI CD DIMENSIONS
MASK FILM SCRAPING AMOUNT
UNDERLAYER SCRAPING AMOUNT
UNIFORMITY
110
SERVER DEVICE (PREDICTION PHASE)
1210
RECIPE GENERATOR
FIRST PREDICTION UNIT
1310
LEARNED SHAPE SIMULATION MODEL
CROSS-SECTIONAL IMAGE DATA
1320
POST-PROCESSING SHAPE DATA CALCULATION UNIT
POST-PROCESSING SHAPE DATA
RECIPE CANDIDATE
1340
RECIPE SEARCH UNIT
ERROR
1330
ERROR CALCULATION UNIT
POST-PROCESSING SHAPE DATA
CROSS-SECTIONAL IMAGE DATA
OPTIMAL RECIPE
OUTPUT UNIT
1350
OPTIMAL RECIPE
OPTIMAL RECIPE, POST-PROCESSING SHAPE DATA, AND CROSS-SECTIONAL IMAGE DATA
1211
INPUT UNIT
1221
OUTPUT UNIT

FIG. 14

OPTIMAL RECIPE AND CROSS-SECTIONAL IMAGE DATA

| CONTROL PARAMETER | | STEP 1 | STEP 2 | STEP 3 | STEP 4 | STEP 5 | STEP 6 | STEP 7 | STEP 8 | STEP 9 |
|---|---|---|---|---|---|---|---|---|---|---|
| RF SIGNAL | HF | HIGH | MEDIUM | LOW | MEDIUM | LOW | MEDIUM | LOW | MEDIUM | LOW |
| | LF | LOW | – | MEDIUM | – | HIGH | – | HIGH | – | HIGH |
| PROCESSING GAS | GAS TYPE | A/B/C | B/D | B/C/E | F/G | A/C/E | A/D | B/C/E | B | C/E/F/G |
| | FLOW RATE | $\alpha/\beta/\gamma$ | $\delta/\varepsilon$ | $\zeta/\eta/\theta$ | $\kappa/\lambda$ | $\mu/\nu/\xi$ | $o/\pi$ | $\rho/\sigma/\tau$ | $\upsilon$ | $\phi/\chi/\psi/\omega$ |
| ESC TEMPERATURE | | MEDIUM | LOW | LOW | HIGH | LOW | LOW | LOW | HIGH | LOW |
| IN-CHAMBER PRESSURE | | MEDIUM | HIGH | LOW | HIGH | LOW | HIGH | MEDIUM | HIGH | HIGH |
| CROSS-SECTIONAL IMAGE DATA | | | | | | | | | | |

1410

1411

POST-PROCESSING SHAPE DATA

| ETCHING RATE | AEI CD DIMENSIONS | MASK FILM SCRAPING AMOUNT | UNDERLAYER SCRAPING AMOUNT | UNIFORMITY |
|---|---|---|---|---|
| | | | | |

1420

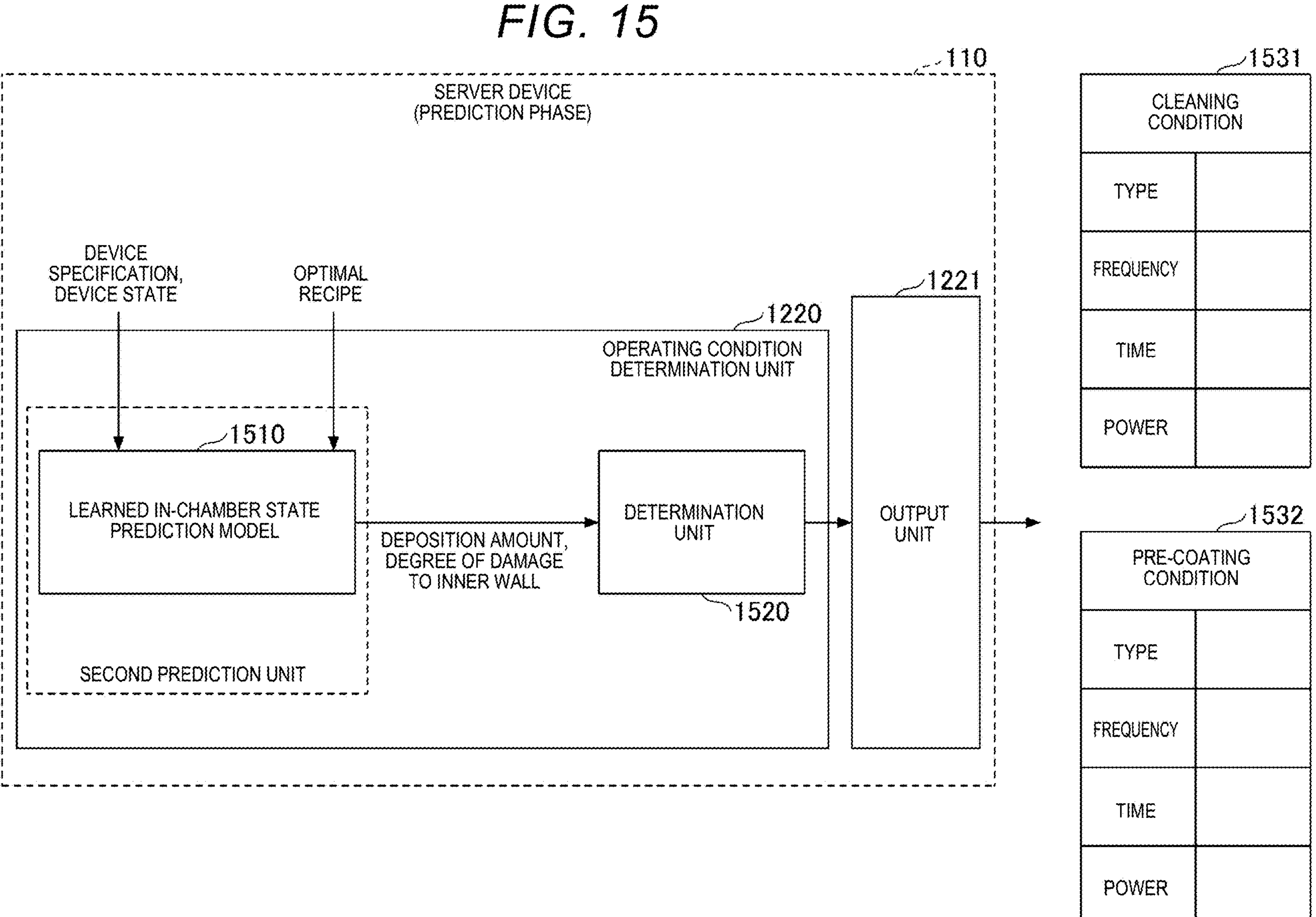
FIG. 15
110
SERVER DEVICE (PREDICTION PHASE)
DEVICE SPECIFICATION, DEVICE STATE
OPTIMAL RECIPE
1220
OPERATING CONDITION DETERMINATION UNIT
1221
1510
LEARNED IN-CHAMBER STATE PREDICTION MODEL
DEPOSITION AMOUNT, DEGREE OF DAMAGE TO INNER WALL
DETERMINATION UNIT
1520
OUTPUT UNIT
SECOND PREDICTION UNIT
1531
CLEANING CONDITION
TYPE
FREQUENCY
TIME
POWER
1532
PRE-COATING CONDITION
TYPE
FREQUENCY
TIME
POWER

FIG. 17

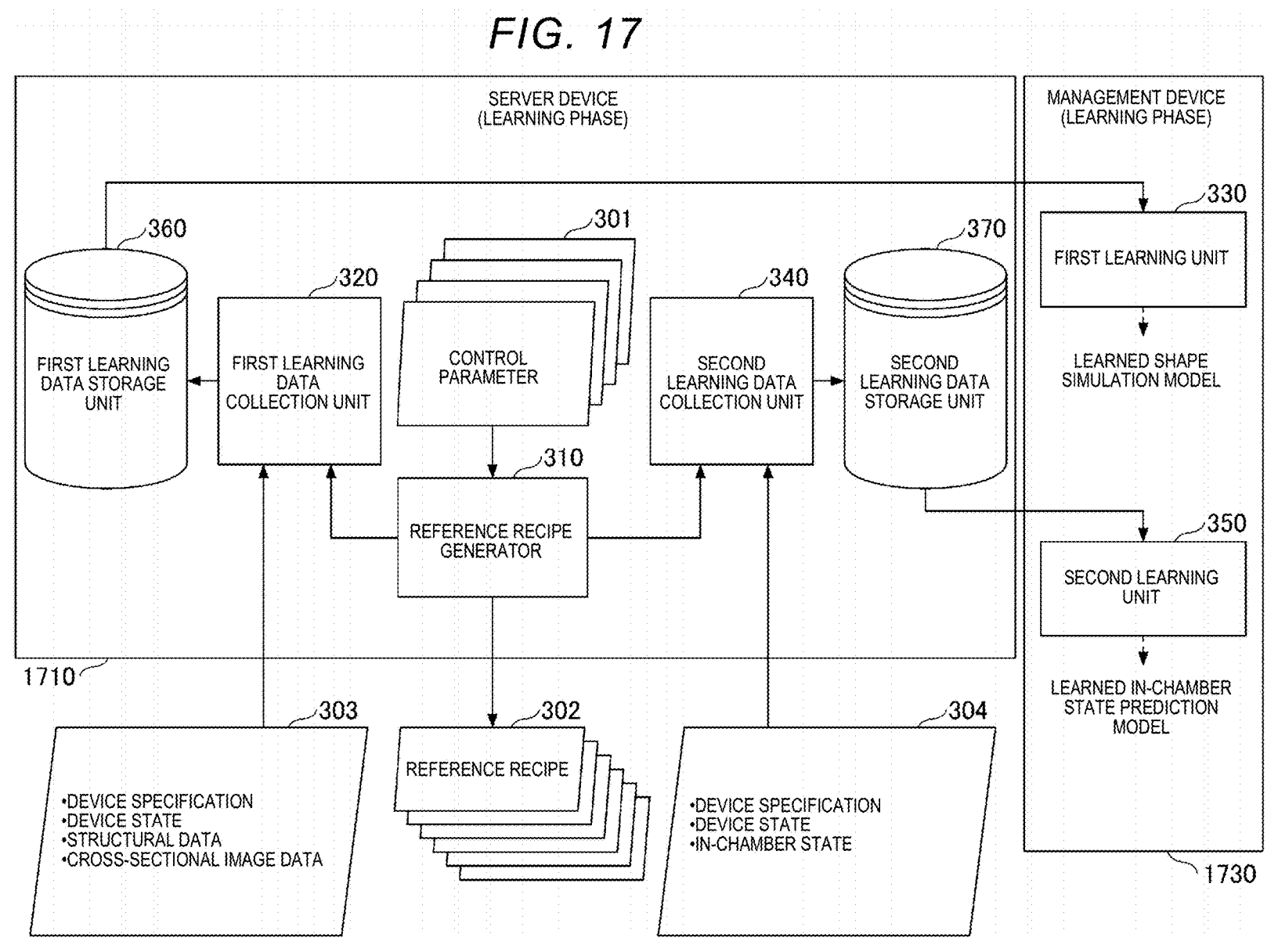

SERVER DEVICE (LEARNING PHASE)
1710
FIRST LEARNING DATA STORAGE UNIT
360
FIRST LEARNING DATA COLLECTION UNIT
320
CONTROL PARAMETER
301
REFERENCE RECIPE GENERATOR
310
SECOND LEARNING DATA COLLECTION UNIT
340
SECOND LEARNING DATA STORAGE UNIT
370

MANAGEMENT DEVICE (LEARNING PHASE)
1730
FIRST LEARNING UNIT
330
LEARNED SHAPE SIMULATION MODEL
SECOND LEARNING UNIT
350
LEARNED IN-CHAMBER STATE PREDICTION MODEL

303
•DEVICE SPECIFICATION
•DEVICE STATE
•STRUCTURAL DATA
•CROSS-SECTIONAL IMAGE DATA

302
REFERENCE RECIPE

304
•DEVICE SPECIFICATION
•DEVICE STATE
•IN-CHAMBER STATE

FIG. 18

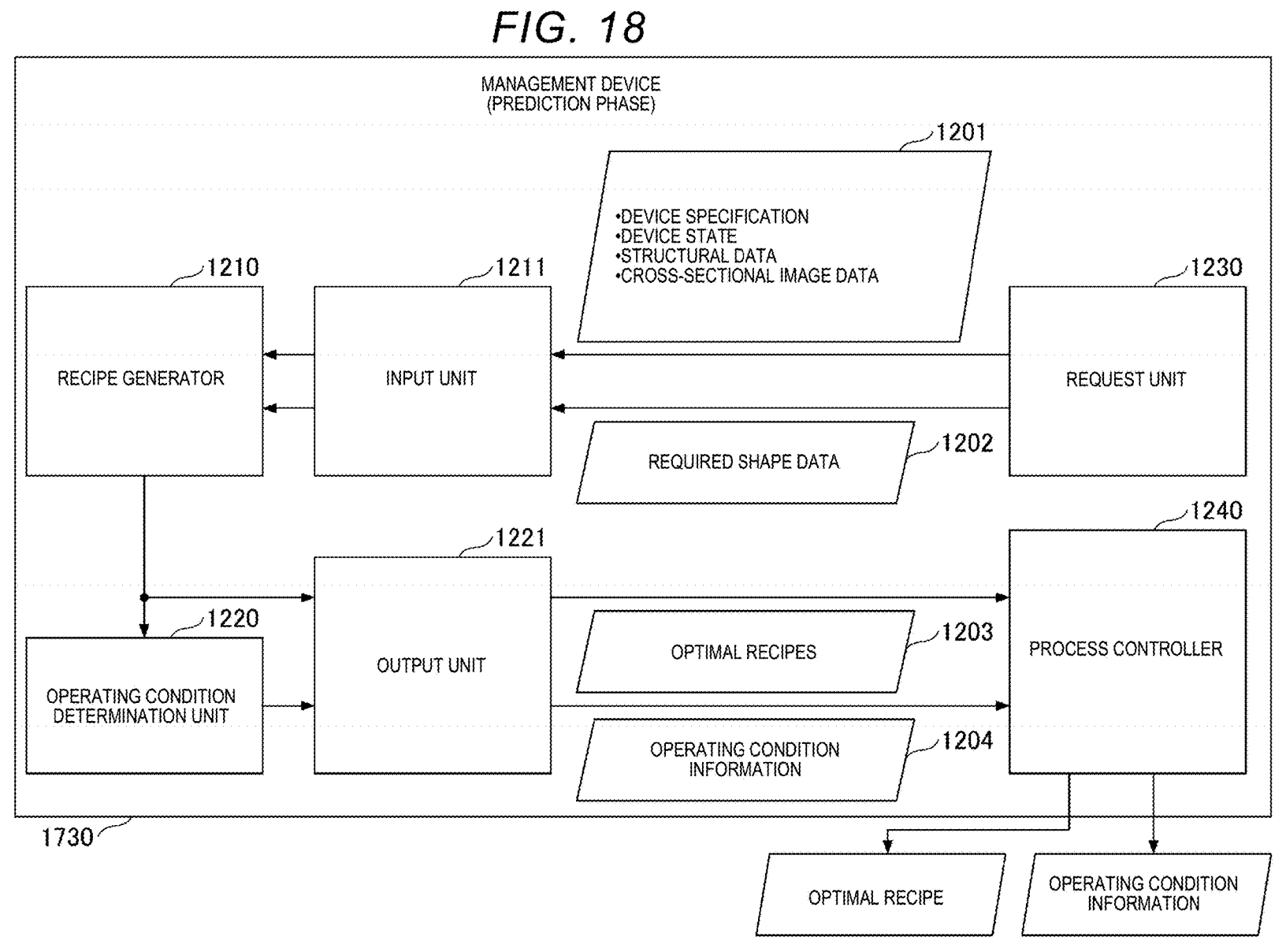

MANAGEMENT DEVICE
(PREDICTION PHASE)

1730

1201
•DEVICE SPECIFICATION
•DEVICE STATE
•STRUCTURAL DATA
•CROSS-SECTIONAL IMAGE DATA

1202
REQUIRED SHAPE DATA

1203
OPTIMAL RECIPES

1204
OPERATING CONDITION INFORMATION

1230
REQUEST UNIT

1240
PROCESS CONTROLLER

1211
INPUT UNIT

1221
OUTPUT UNIT

1210
RECIPE GENERATOR

1220
OPERATING CONDITION DETERMINATION UNIT

OPERATING CONDITION INFORMATION

OPTIMAL RECIPE

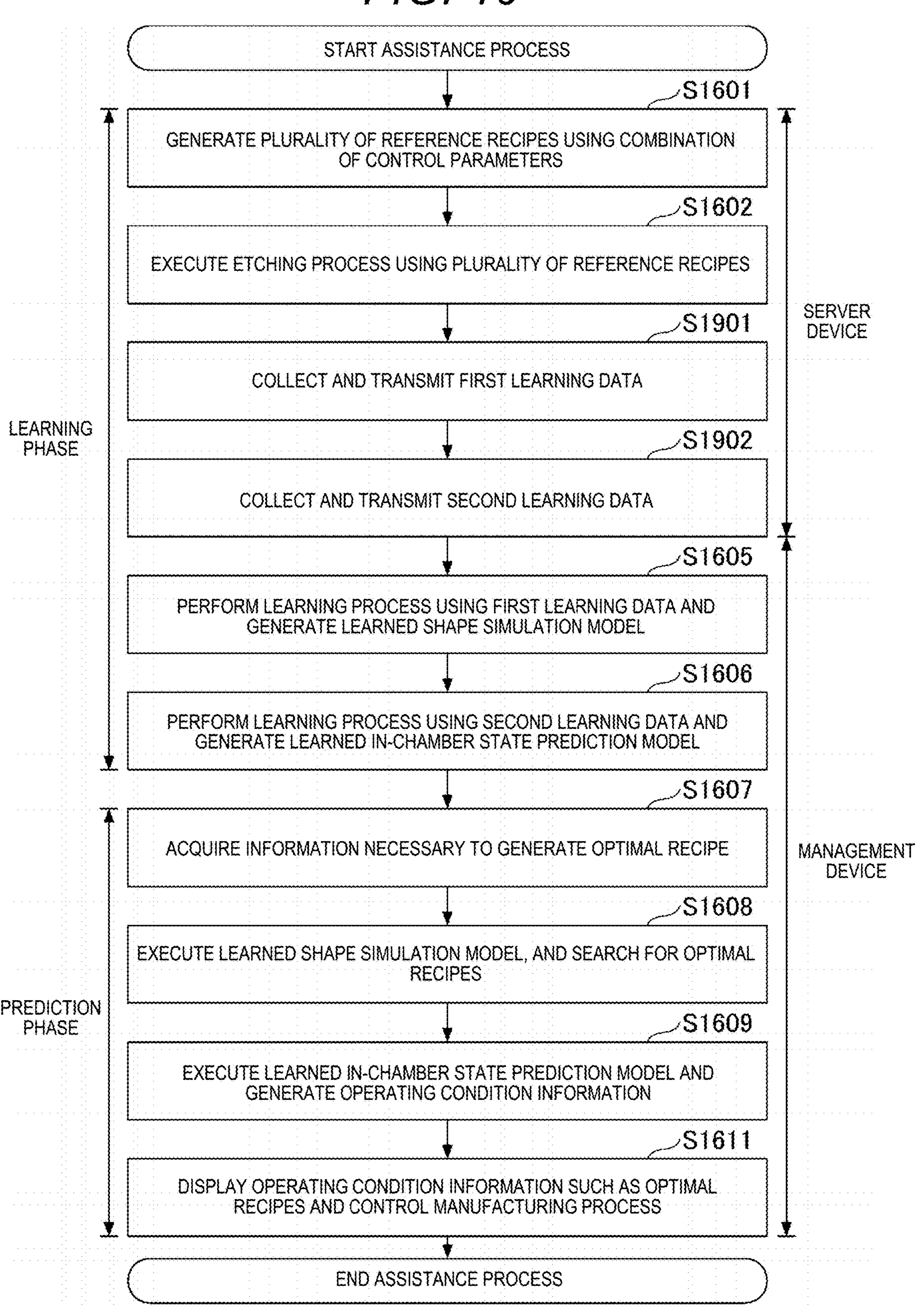
FIG. 19
START ASSISTANCE PROCESS
S1601
GENERATE PLURALITY OF REFERENCE RECIPES USING COMBINATION OF CONTROL PARAMETERS
S1602
EXECUTE ETCHING PROCESS USING PLURALITY OF REFERENCE RECIPES
S1901
COLLECT AND TRANSMIT FIRST LEARNING DATA
S1902
COLLECT AND TRANSMIT SECOND LEARNING DATA
S1605
PERFORM LEARNING PROCESS USING FIRST LEARNING DATA AND GENERATE LEARNED SHAPE SIMULATION MODEL
S1606
PERFORM LEARNING PROCESS USING SECOND LEARNING DATA AND GENERATE LEARNED IN-CHAMBER STATE PREDICTION MODEL
S1607
ACQUIRE INFORMATION NECESSARY TO GENERATE OPTIMAL RECIPE
S1608
EXECUTE LEARNED SHAPE SIMULATION MODEL, AND SEARCH FOR OPTIMAL RECIPES
S1609
EXECUTE LEARNED IN-CHAMBER STATE PREDICTION MODEL AND GENERATE OPERATING CONDITION INFORMATION
S1611
DISPLAY OPERATING CONDITION INFORMATION SUCH AS OPTIMAL RECIPES AND CONTROL MANUFACTURING PROCESS
END ASSISTANCE PROCESS
LEARNING PHASE
PREDICTION PHASE
SERVER DEVICE
MANAGEMENT DEVICE

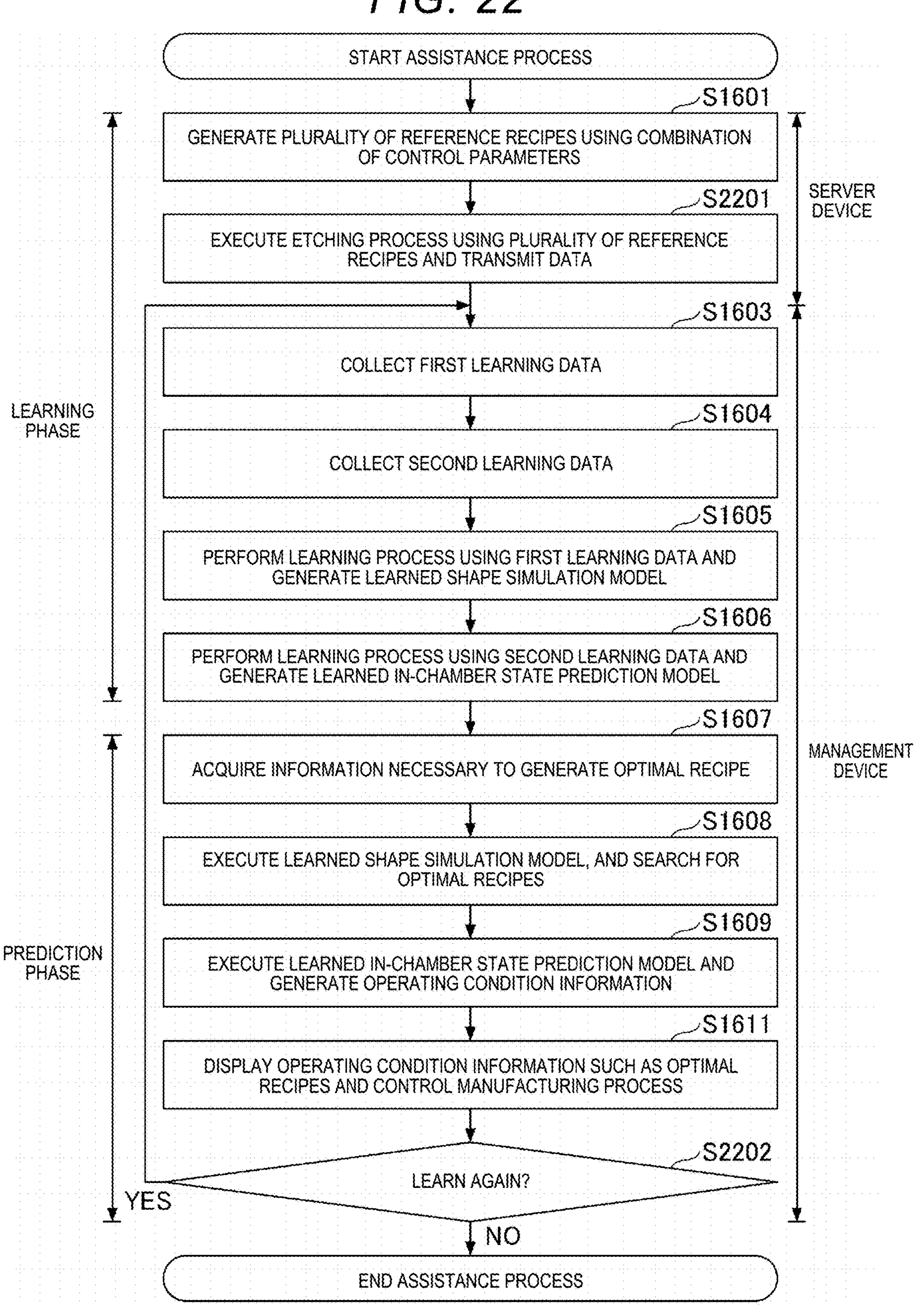
FIG. 22
START ASSISTANCE PROCESS
S1601
GENERATE PLURALITY OF REFERENCE RECIPES USING COMBINATION OF CONTROL PARAMETERS
S2201
EXECUTE ETCHING PROCESS USING PLURALITY OF REFERENCE RECIPES AND TRANSMIT DATA
SERVER DEVICE
S1603
COLLECT FIRST LEARNING DATA
S1604
COLLECT SECOND LEARNING DATA
LEARNING PHASE
S1605
PERFORM LEARNING PROCESS USING FIRST LEARNING DATA AND GENERATE LEARNED SHAPE SIMULATION MODEL
S1606
PERFORM LEARNING PROCESS USING SECOND LEARNING DATA AND GENERATE LEARNED IN-CHAMBER STATE PREDICTION MODEL
S1607
ACQUIRE INFORMATION NECESSARY TO GENERATE OPTIMAL RECIPE
MANAGEMENT DEVICE
S1608
EXECUTE LEARNED SHAPE SIMULATION MODEL, AND SEARCH FOR OPTIMAL RECIPES
S1609
EXECUTE LEARNED IN-CHAMBER STATE PREDICTION MODEL AND GENERATE OPERATING CONDITION INFORMATION
PREDICTION PHASE
S1611
DISPLAY OPERATING CONDITION INFORMATION SUCH AS OPTIMAL RECIPES AND CONTROL MANUFACTURING PROCESS
S2202
LEARN AGAIN?
YES
NO
END ASSISTANCE PROCESS

PLASMA PROCESSING SYSTEM, ASSISTANCE DEVICE, ASSISTANCE METHOD, AND ASSISTANCE PROGRAM

CROSS-REFERENCE TO RELATED APPLICATIONS

This application is a bypass continuation application of international application No. PCT/JP2023/024813 having an international filing date of Jul. 4, 2023 and designating the United States, the international application being based upon and claiming the benefit of priority from Japanese Patent Application No. 2022-113776, filed on Jul. 15, 2022, the entire contents of which are incorporated herein by reference.

TECHNICAL FIELD

The present disclosure relates to a plasma processing system, an assistance device, an assistance method, and an assistance program.

BACKGROUND

In a plasma processing device, there are a plurality of control parameters that affect processing performance. For example, Patent Literature 1 discloses that the control parameters are derived using a machine learning model.

CITATION LIST

Patent Documents

Patent Literature 1: WO 2021/081213

SUMMARY

The present disclosure assists the improvement of processing performance in a plasma processing device.

A plasma processing system according to an aspect of the present disclosure has, for example, the following configuration. That is, there is provided a plasma processing system including:

a plasma processing device;

an assistance device; and a control device, in which the plasma processing device includes a plasma processing chamber, a substrate support set in the plasma processing chamber, the substrate support including at least one electrode and at least one heating element, a gas supply configured to supply at least one processing gas into the plasma processing chamber, a source RF generator configured to generate a source RF signal for forming a plasma from the at least one processing gas supplied into the plasma processing chamber, and a bias generator configured to supply a bias signal to the at least one electrode, the assistance device includes an input unit configured to acquire a first input related to a structure of a pre-processing substrate, a second input related to a required shape of a post-processing substrate, a third input related to a specification of the plasma processing device, and a fourth input related to a state of the plasma processing device, a first determination unit configured to determine, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, the plurality of control parameters including a first control parameter related to a temporal change of a power level of the source RF signal, a second control parameter related to a temporal change of a power level of the bias signal, a third control parameter related to a temporal change of a type and flow rate of the at least one processing gas, and a fourth control parameter related to a temporal change of a temperature of the at least one heating element, and the first machine learning model being trained in advance based on a plurality of experimental results and a plurality of simulation results, a second determination unit configured to determine, based on the plurality of determined control parameters, the third input, and the fourth input, an operating condition of the plasma processing device using a second machine learning model, the operating condition including a cleaning condition and/or a coating condition for the plasma processing chamber, and the second machine learning model being trained in advance based on a plurality of experimental results and a plurality of simulation results, and an output unit configured to output the plurality of determined control parameters and the determined operating condition to the control device, and the control device is configured to control the plasma processing device to process the pre-processing substrate based on the plurality of determined control parameters and the determined operating condition.

According to the present disclosure, it is possible to assist the improvement of the processing performance in the plasma processing device.

BRIEF DESCRIPTION OF DRAWINGS

FIG. 3 is a diagram illustrating an example of the functional configuration of the server device in a learning phase.

FIG. 4 is a diagram illustrating a list of control parameters.

FIG. 6 is a diagram illustrating a specific example of a reference recipe.

FIG. 7 is a diagram illustrating a specific example of first learning data.

FIG. 9 is a diagram illustrating a specific example of second learning data.

FIG. 12 is a first diagram illustrating an example of the functional configurations of a server device and a management device in the prediction phase.

FIG. 13 is a diagram illustrating details of the process of a recipe generator.

FIG. 14 is a diagram illustrating examples of an optimal recipe, cross-sectional image data, and post-processing shape data.

FIG. 15 is a diagram illustrating details of the process of an operating condition determination unit.

FIG. 17 is a first diagram illustrating an example of the functional configurations of the server device and the management device in the learning phase.

FIG. 18 is a diagram illustrating an example of the functional configuration of the management device in the prediction phase.

FIG. 19 is a second flowchart illustrating the flow of the assistance process.

FIG. 22 is a fourth flowchart illustrating the flow of the assistance process.

DETAILED DESCRIPTION

In the following, embodiments of the present invention will be described with reference to the accompanying drawings. In the specification and drawings, elements having substantially the same functions or configurations are referred to by the same numerals, and a duplicate description thereof will be omitted.

First Embodiment

<System Configuration of Plasma Processing System>

First, a system configuration of a plasma processing system that assists an etching process executed in a plasma processing device in a manufacturing process will be described. Since the system configuration of the plasma processing system in the present embodiment is different between the learning phase and the prediction phase, the system configuration of the plasma processing system in the learning phase will be described first.

Figure 1:
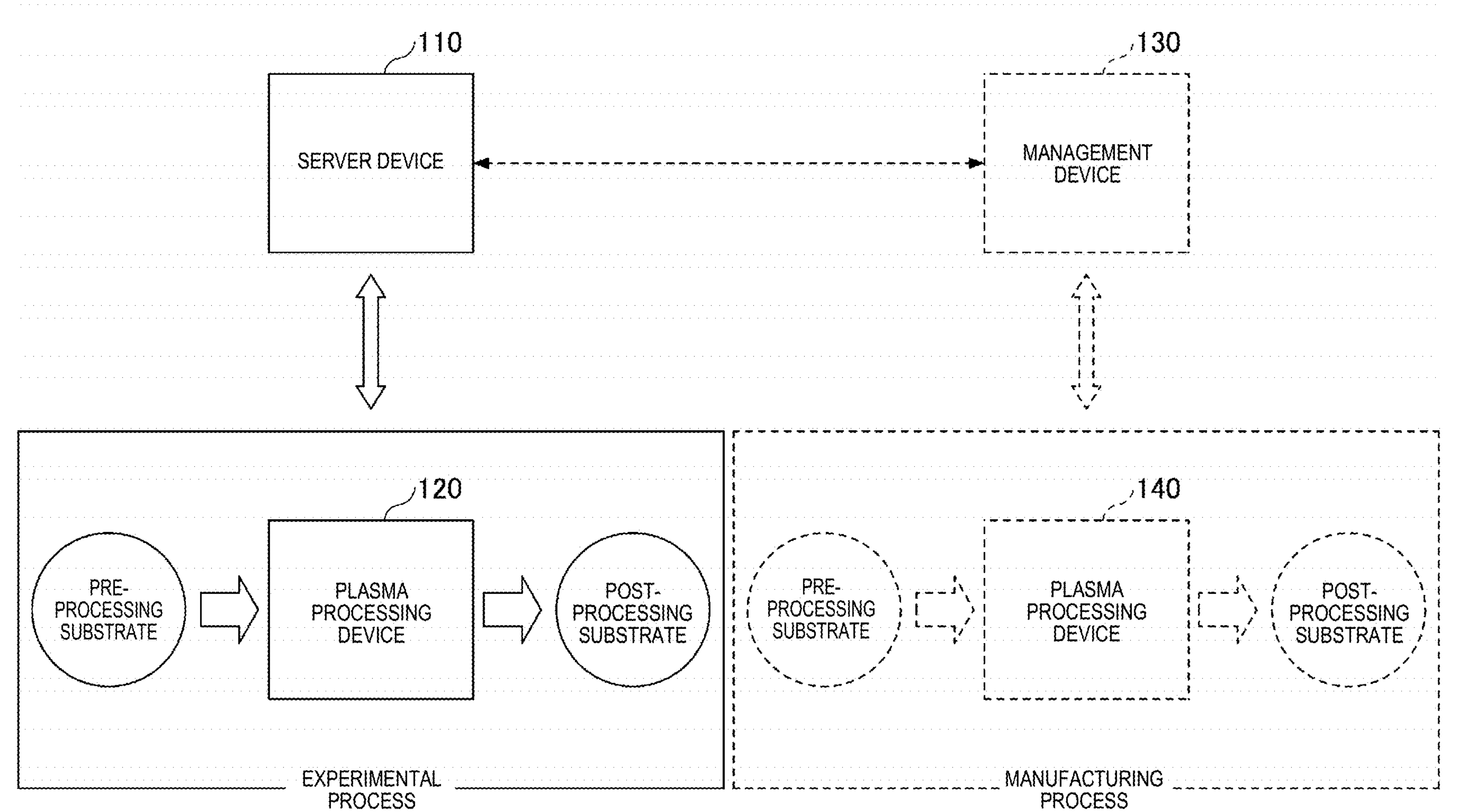
FIG. 1 is a diagram illustrating an example of the system configuration of a plasma processing system in a learning phase.

FIG. 1 is a diagram illustrating an example of the system configuration of a plasma processing system in a learning phase. As illustrated in FIG. 1, a plasma processing system 100 in the learning phase includes a server device 110 and an experimental process.

The server device 110 is an example of an assistance device. An assistance program is installed in the server device 110. In the learning phase, the server device 110 executes the program to cause a plasma processing device 120 in the experimental process to execute an etching process, thereby collecting data.

Specifically, the server device 110 causes the plasma processing device 120 to execute the etching process based on a plurality of reference recipes. In this way, the plasma processing device 120 in the experimental process generates a plurality of post-processing substrates corresponding to the respective reference recipes, from the plurality of pre-processing substrates.

Further, the server device 110 collects data acquired by executing the etching process, and performs a learning process with respect to a shape simulation model for predicting the shape of the post-processing substrate. In this way, the server device 110 generates a learned shape simulation model (first machine learning model). The first machine learning model is trained in advance based on a plurality of experimental results and a plurality of simulation results.

Further, the server device 110 collects data acquired by executing the etching process, and performs a learning process with respect to an in-chamber state prediction model for predicting a state in the plasma processing chamber after the etching process. In this way, the server device 110 generates a learned in-chamber state prediction model (second machine learning model). The second machine learning model is trained in advance based on a plurality of experimental results and a plurality of simulation results.

The server device 110 is communicably connected to a management device 130 via a network. In this way, the server device 110

- can provide, as elements that affect the processing performance of a plasma processing device 140,|
- an optimal recipe (an optimal recipe used in a case where the plasma processing device 140 in a manufacturing process execute the etching process) generated by executing the learned shape simulation model, and
- operating conditions for the plasma processing device 140 in a manufacturing process, the operating conditions being generated by executing the learned in-chamber state prediction model.

<Outline of Plasma Processing Device>

Figure 2A:
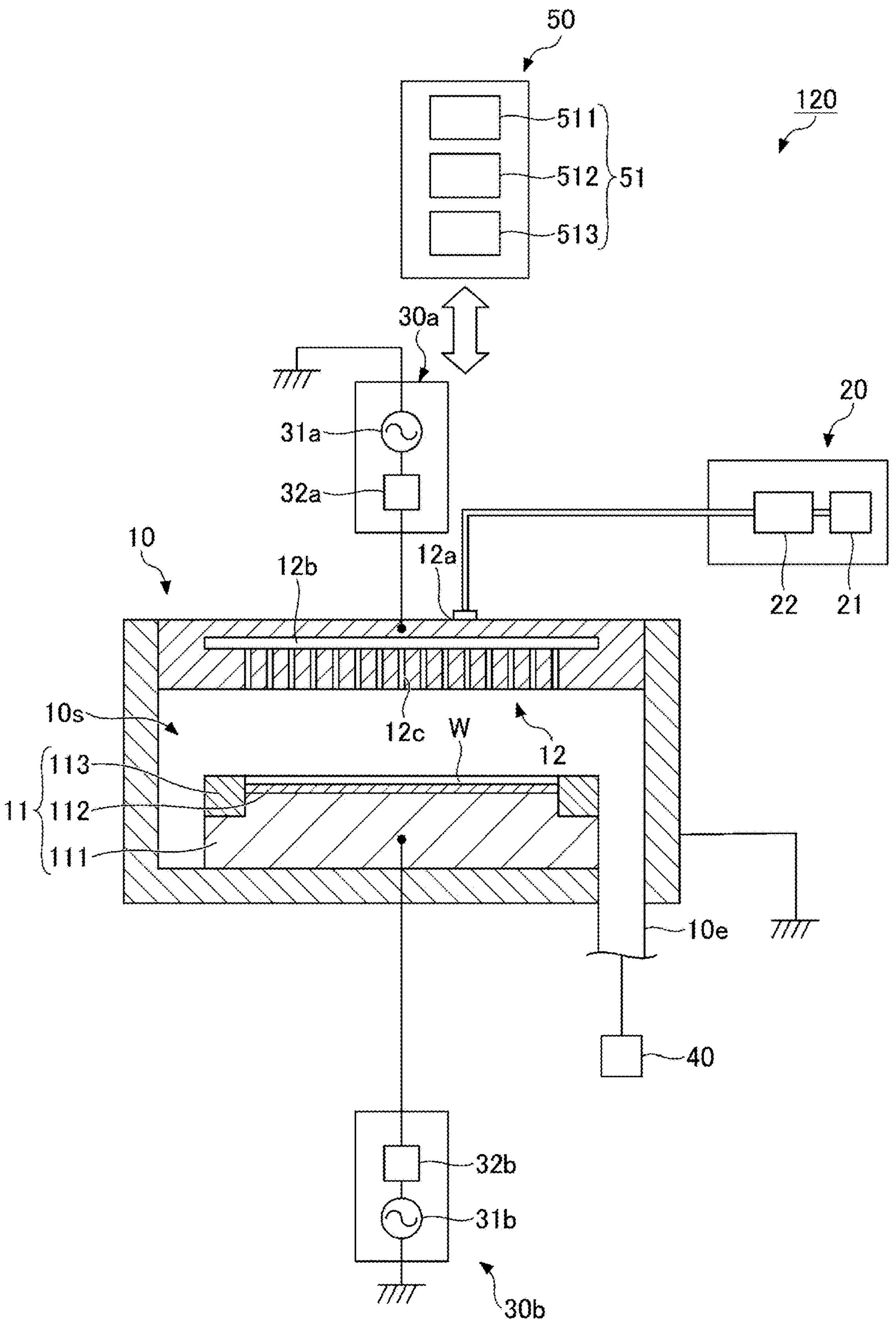
FIG. 2A is a diagram for describing an outline of a plasma processing device.

Next, an outline of the plasma processing device 120 will be described. FIG. 2A is a diagram for describing an outline of the plasma processing device.

As illustrated in FIG. 2A, the plasma processing device 120 includes a plasma processing chamber 10, a gas supply 20, a radio frequency (RF) power supply 30, an exhaust system 40, and a controller 50.

In the present embodiment, the plasma processing chamber 10 includes a substrate support 11 and an upper electrode showerhead assembly 12. The substrate support 11 is set in a lower region of a processing space 10*s* in the plasma processing chamber 10. The upper electrode showerhead assembly 12 is disposed above the substrate support 11 and may function as a part of a top plate of the plasma processing chamber 10.

The substrate support 11 is configured to support a substrate W in the processing space 10*s*. In the present embodiment, the substrate support 11 includes a lower electrode 111, an electrostatic chuck 112, and an edge ring 113. The electrostatic chuck 112 is disposed on the lower electrode 111, and configured to support the substrate W on the upper surface thereof. The edge ring 113 is disposed to surround the substrate W on the upper surface of the peripheral edge of the lower electrode 111.

The upper electrode showerhead assembly 12 is configured to supply one or more processing gases from the gas supply 20 into the processing space 10*s*. In the present embodiment, the upper electrode showerhead assembly 12 includes a gas inlet 12*a*, a gas diffusion chamber 12*b*, and a plurality of gas outlets 12*c*. The gas inlet 12*a* is in fluid communication with the gas supply 20 and the gas diffusion chamber 12*b*. The plurality of gas outlets 12*c* are in fluid communication with the gas diffusion chamber 12*b* and the processing space 10*s*. In the present embodiment, the upper electrode showerhead assembly 12 is configured to supply one or more processing gases from the gas inlet 12*a* into the processing space 10*s* via the gas diffusion chamber 12*b* and the plurality of gas outlets 12*c*.

The gas supply 20 may include one or more gas sources 21 and one or more flow controllers 22. In the present embodiment, the gas supply 20 is configured to supply one or more processing gases from the respective gas sources 21 to the gas inlet 12*a* via the respective flow controllers 22. Each flow controller 22 may include, for example, a mass flow controller or a pressure-controlled flow controller. Further, the gas supply 20 may include one or more flow modulation devices that modulate or pulse flow rates of one or more processing gases.

Therefore, the RF power supply 30 is configured to supply RF power, for example, one or more RF signals to one or more electrodes such as the lower electrode 111, the upper electrode showerhead assembly 12, or both the lower electrode 111 and the upper electrode showerhead assembly 12. In the present embodiment, the RF power supply 30 includes a first RF power supply 30*a* and a second RF power supply 30*b*. The RF spectrum encompasses a portion of the electromagnetic spectrum ranging from 3 Hz to 3000 GHz. With respect to an electronic material process such as a semiconductor process, the RF spectrum used for forming plasma is preferably in the range of 100 kHz to 3 GHZ, more preferably 200 kHz to 150 MHz. The first RF power supply 30*a* includes a first RF generator 31*a* (an example of a source RF generator) and a first matching circuit 32*a*. The first RF power supply 30*a* shown in the present embodiment is configured to supply a first RF signal (which is an example of a source RF signal) from the first RF generator 31*a* to the upper electrode showerhead assembly 12 via the first matching circuit 32*a*. For example, the first RF signal may have a frequency within a range of 27 MHz to 100 MHz. The second RF power supply 30*b* includes a second RF generator 31*b* (an example of a bias generator) and a second matching circuit 32*b*. The second RF power supply 30*b* shown in the present embodiment is configured to supply a second RF signal (an example of a bias signal) from the second RF generator 31*b* to the lower electrode 111 via the second matching circuit 32*b*. For example, the second RF signal may have a frequency within a range of 400 kHz to 13.56 MHz. Alternatively, a direct current (DC) pulse generator may be used instead of the second RF generator 31*b*. Further, although not illustrated, other embodiments will be considered here. For example, in an alternative embodiment, the RF power supply 30 may be configured to supply the first RF signal from the RF generator to the lower electrode 111, and supply the second RF signal from another RF generator to the lower electrode 111. Further, the RF power supply 30 may be configured to supply a third RF signal from still another RF generator to the upper electrode showerhead assembly 12. Further, in other alternative embodiments, a DC voltage may be applied to the upper electrode showerhead assembly 12. Further, in various embodiments, amplitudes of one or more RF signals (that is, the first RF signal, the second RF signal, and the like) may be changed into a pulse or modulated. The amplitude modulation may include pulsating the RF signal amplitude between an ON state and an OFF state, or between two or more different ON states. The phase matching of the RF signals may be controlled, and the phase matching of the amplitude modulation of the two or more RF signals may be synchronized or asynchronous.

The exhaust system 40 may be connected to, for example, an exhaust port 10*e* disposed at a bottom portion of the plasma processing chamber 10. The exhaust system 40 may include a pressure valve, a vacuum pump such as a turbo molecular pump, a roughing pump, or a combination thereof.

In the present embodiment, the controller 50 processes computer-executable instructions for causing the plasma processing device 120 to execute various steps to be described herein. The controller 50 may be configured to control the respective elements of the plasma processing device 120 to execute the various steps described herein below. The controller 50 may include, for example, a computer 51. For example, the computer 51 may include a Central Processing Unit (CPU) 511, a storage unit 512, and a communication interface 513. The CPU 511 may be configured to perform various control operations based on a program stored in the storage unit 512. The storage unit 512 may include at least one memory type selected from the group consisting of a Random Access Memory (RAM), a Read Only Memory (ROM), and an auxiliary storage device such as a Hard Disk Drive (HDD) or a Solid State Drive (SSD). The communication interface 513 may communicate with the plasma processing device 120 via a communication line such as a Local Area Network (LAN).

<Hardware Configuration of Server Device>

Figure 2B:
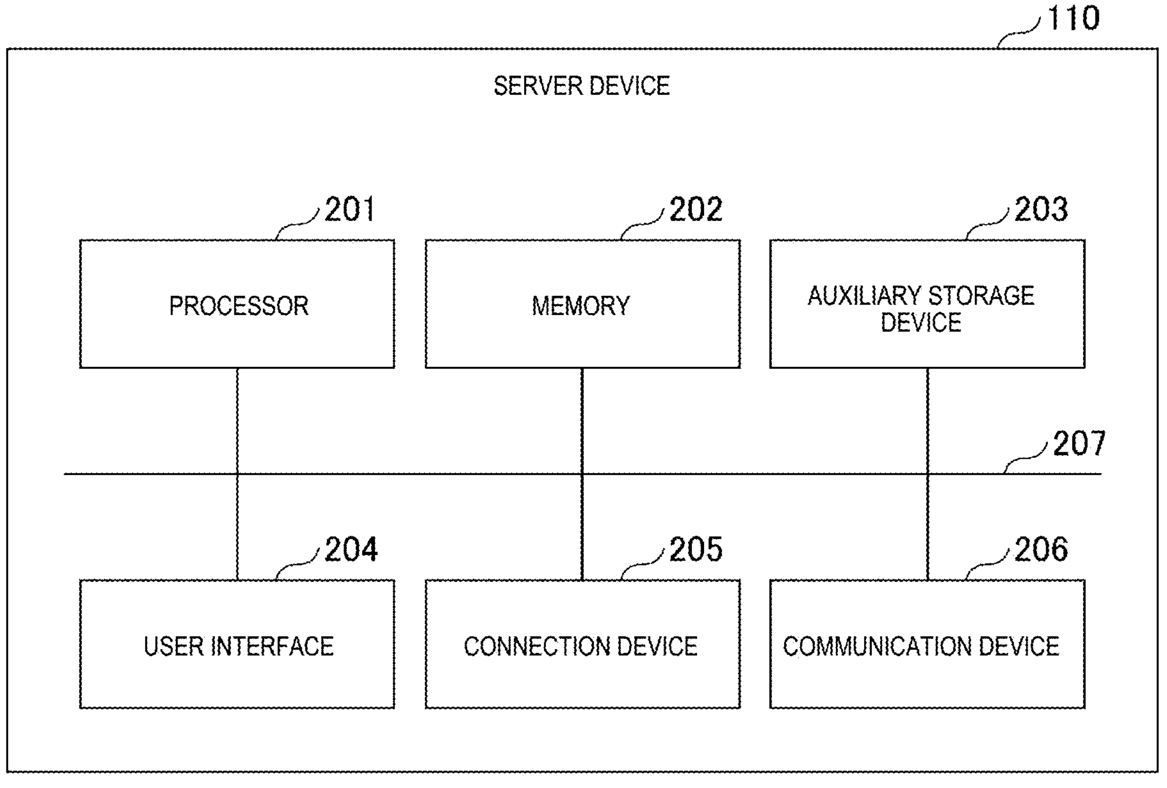
FIG. 2B is a diagram illustrating an example of the hardware configuration of a server device.

Next, the hardware configuration of the server device 110 will be described. FIG. 2B is a diagram illustrating an example of the hardware configuration of a server device.

As illustrated in FIG. 2B, the server device 110 includes a processor 201, a memory 202, an auxiliary storage device 203, a user interface device 204, a connection device 205, and a communication device 206. The respective hardware components of the server device 110 are connected to each other via a bus 207.

The processor 201 includes various arithmetic devices such as a CPU and a Graphics Processing Unit (GPU). The processor 201 reads various programs (for example, assistance programs) onto the memory 202 to execute the programs.

The memory 202 includes a main storage device such as the ROM or the RAM. The processor 201 and the memory 202 form a so-called computer. The processor 201 executes various programs read onto the memory 202, so that the computer achieves the various functions.

The auxiliary storage device 203 stores various programs, and stores various data and the like used when the various programs are executed by the processor 201.

The user interface device 204 includes, for example, a keyboard or a touch panel through which the user of the server device 110 performs an input operation of various commands, and a display device that displays processing details of the server device 110.

The connection device 205 is a connection device connected to each device in the experimental process. The communication device 206 is a communication device for communicating with the management device 130 via a network.

Here, although the hardware configuration of the server device 110 has been described, the hardware configuration of the management device 130 is substantially the same.

<Functional Configuration of Server Device in Learning Phase>

Next, the functional configuration of the server device 110 in the learning phase will be described. FIG. 3 is a diagram illustrating an example of the functional configuration of the server device in the learning phase. As illustrated in FIG. 3, in the learning phase, the server device 110 functions as a reference recipe generator 310, a first learning data collection unit 320, a first learning unit 330, a second learning data collection unit 340, and a second learning unit 350.

The reference recipe generator 310 generates a plurality of reference recipes 302 based on a plurality of control parameters 301 that affect processing performance. The reference recipe generator 310 generates a plurality of reference recipes composed of a plurality of steps by generating a plurality of combinations of change patterns obtained by changing the control parameters 301 for each step.

Further, the reference recipe generator 310 transmits the generated plurality of reference recipes 302 to the plasma processing device 120, and causes to execute an etching process based on the respective reference recipes. Further, the reference recipe generator 310 notifies the generated plurality of reference recipes 302 to the first learning data collection unit 320 and the second learning data collection unit 340.

The first learning data collection unit 320 acquires the plurality of reference recipes 302, and collects data 303 (for example, experimental results) acquired as a result of the plasma processing device 120 executing an etching process under the plurality of reference recipes 302, respectively. Here, the description is made so that a plurality of experimental results are collected as the data 303. However, the data 303 may include a plurality of simulation results.

As illustrated in FIG. 3, the data 303 collected by the first learning data collection unit 320 includes a device specification, a device state, structural data, and cross-sectional image data, each of which is described in detail below.

- Device specification: Identifier for identifying the type of the plasma processing device 120
- Device state: RF integration time of the plasma processing device 120
- Structural data: Data related to the structure of the pre-processing substrate on which etching process is performed by the plasma processing device 120, specifically,
- Identifier indicating the pattern structure (perfectly circular hole/elliptical hole, trench structure)
- Type of mask material
- Type of etched film material (monolayer film or laminated film)
- ADI CD dimension (After Development Inspection (ADI))
- Film thickness
- Opening rate
- Cross-sectional image data: image data obtained by photographing a cross-section of a pre-processing substrate on which the etching process is performed by the plasma processing device 120, and image data obtained by photographing a cross-section of the substrate at the end of each step. The image data obtained by photographing the cross-section of a pre-processing substrate is associated with the structural data described above.

The first learning data collection unit 320 stores the acquired plurality of reference recipes 302 in a first learning data storage unit 360 in association with the corresponding data 303.

The first learning unit 330 performs a learning process with respect to the shape simulation model to generate a learned shape simulation model. Specifically, the first learning unit 330 inputs, as input data, the device specification, the device state, the structural data, the reference recipes, and cross-sectional image data (image data obtained by photographing a cross-section of the pre-processing substrate), into the shape simulation model. Further, the first learning unit 330 updates the model parameters so that the output data output from the shape simulation model approaches the cross-sectional image data (the image data obtained by photographing a cross-section of the substrate at the end of each step), which is the correct data. In this way, the first learning unit 330 can generate the learned shape simulation model that predicts cross-sectional image data of a substrate on which the etching process is being performed and a substrate obtained after the etching process is performed.

The second learning data collection unit 340 acquires a plurality of reference recipes 302, and collects the data 304 (experimental results) acquired as a result of the plasma processing device 120 executing each etching process under the plurality of reference recipes 302. Here, the description is made so that a plurality of experimental results are collected as the data 304. However, the data 304 may include a plurality of simulation results.

As illustrated in FIG. 3, the data 304 collected by the second learning data collection unit 340 includes the device specification, the device state, and the in-chamber state. Details of each of these are as follows.

- Device specification: Identifier for identifying the type of the plasma processing device 120
- Device state: RF integration time of the plasma processing device 120
- In-chamber state: The amount of deposition (deposits) deposited on the inner wall of the plasma processing chamber of the plasma processing device 120 after the etching process, or the degree of damage to the inner wall of the plasma processing chamber of the plasma processing device 120 after the etching process.

The second learning data collection unit 340 stores the acquired plurality of reference recipes 302 in a second learning data storage unit 370 in association with the corresponding data 304.

The second learning unit 350 performs a learning process with respect to the in-chamber state model to generate a learned in-chamber state model. Specifically, the second learning unit 350 inputs the device specification, the device state, and the reference recipes as input data into the in-chamber state model. Further, the second learning unit 350 updates the model parameters so that the output data output from the in-chamber state model approaches the in-chamber state which is the correct data. In this way, the second learning unit 350

- can generate a learned in-chamber state model that predicts
- the amount of deposition deposited on the inner wall of the plasma processing chamber of the plasma processing device after the etching process, or.
- the degree of damage to the inner wall of the plasma processing chamber of the plasma processing device after the etching process.

<Details of Control Parameters>

Next, details of a plurality of control parameters that affect processing performance will be described. FIG. 4 is a diagram illustrating a list of control parameters. As illustrated in FIG. 4, in the present embodiment, the control parameters include the power level of the RF signal, the type and flow rate of the processing gas, the Electrostatic Chuck (ESC) temperature (the temperature of the substrate support), and the in-chamber pressure. In one embodiment, the ESC temperature includes a temperature of at least one heating element in the substrate support.

Further, as illustrated in FIG. 4, in the present embodiment, each control parameter has a plurality of states that change over time. For example, the source RF signal (HF) and the bias signal (LF) periodically change into a pulse shape in an order of several usec. Further, the type and flow rate of the processing gas, the ESC temperature, and the in-chamber pressure change over time every several seconds to several tens of seconds. In one embodiment, the periodic pulse patterns of the source RF signal (HF) and the bias signal (LF) also change over time every several seconds to several tens of seconds. In one embodiment, the bias DC signal may be used instead of the bias signal (LF).

By changing each control parameter over time, as illustrated in FIG. 4, for the RF signal, the ion/electron density,
the radical density, the composition,
the ion angle distribution, and the ion energy
can be controlled, and, for the processing gas type and the flow rate,
the formation of a protective film of the inner wall of the plasma processing chamber,
the radical density, and the composition
can be controlled, and, for the ESC temperature,
the reaction speed, and
the radical adhesion coefficient
can be controlled, and, for the in-chamber pressure,
the ion angle distribution,
the radical/ion ratio, and
the radical composition
can be controlled.

That is, by changing each control parameter over time, the processing performance can be finely controlled, and the etching performance can be improved.

Combination of Control Parameters

Figure 5:
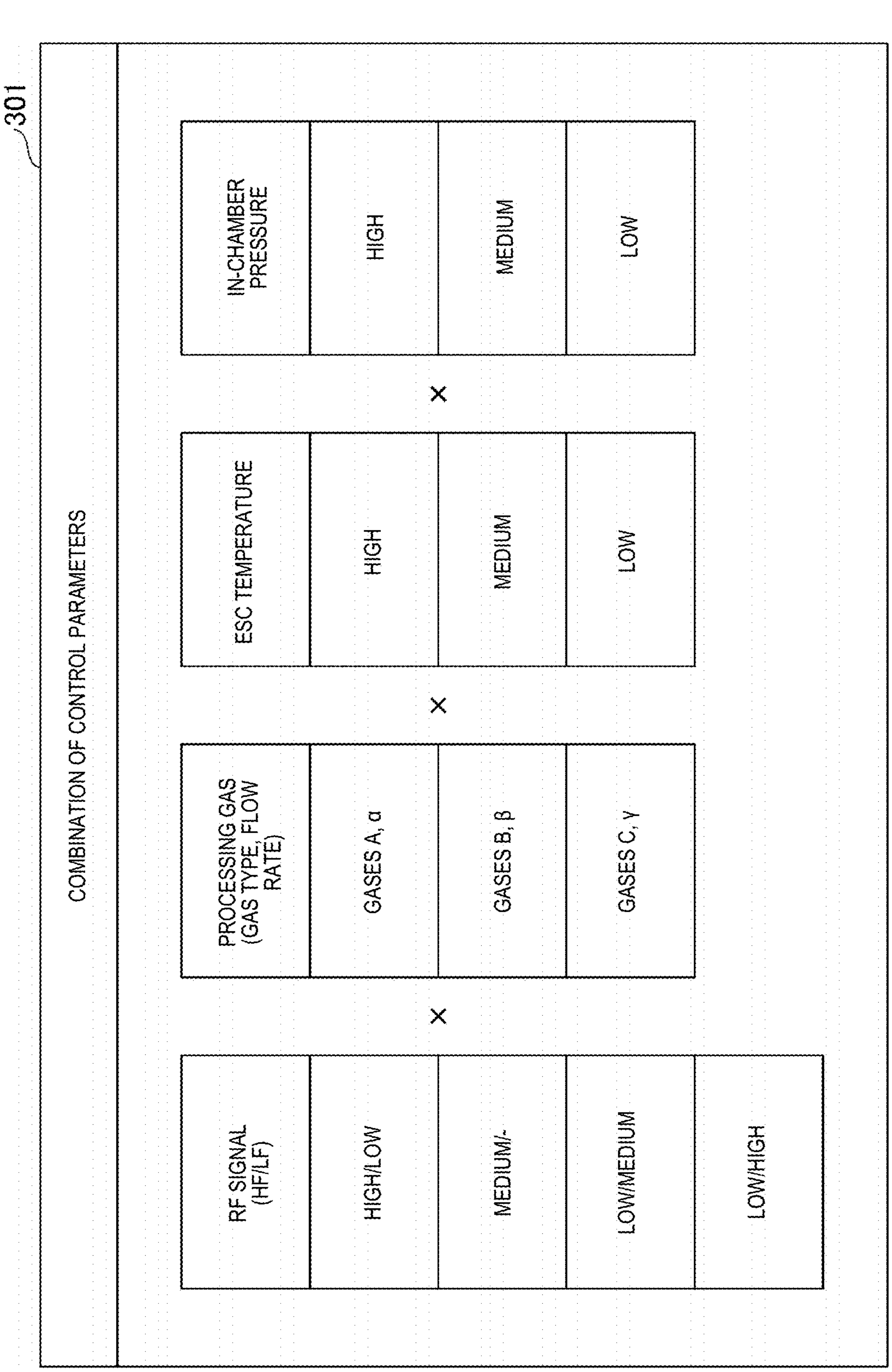
FIG. 5 is a diagram illustrating a combination example of the control parameters.

Next, a description will be given with respect to combination examples of control parameters in each step when the control parameters are changed for each step over time. FIG. 5 is a diagram illustrating a combination example of the control parameters.

The example of FIG. 5 shows that, for example, four types of changes (HF/LF=(High/Low), (Medium/–), (Low/Medium), and (Low/High)) are used as a change method in a case of changing the RF signal over time.

Further, the example of FIG. 5 indicates that, for example, there are three types of changes (types of processing gases, flow rates=(gases A, α), (gases B, β), and (gases C, γ)) as the change method in a case of changing the type and flow rate of the processing gas over time. However, in the case of the processing gas, since steps can be used in combination, the number of types of combinations further increases.

Further, the example of FIG. 5 indicates that there are, for example, three types of changes (high, medium, and low) as the change method in a case of changing the ESC temperature over time.

Further, the example of FIG. 5 indicates that there are, for example, three types of changes (high, medium, and low) as the change method in a case of changing the in-chamber pressure over time.

<Specific Examples of Reference Recipes>

Next, a specific example of the plurality of reference recipes 302 generated by the reference recipe generator 310 will be described. FIG. 6 is a diagram illustrating a specific example of a reference recipe. In the example of FIG. 6, the number of steps of the plurality of reference recipes 302 is set to "9". However, the number of steps included in the reference recipe is not limited to "9".

According to the examples of FIG. 6, in the case of the reference recipe 1, the RF signal changes into a pulse shape in the order of (high/low)→(medium/–)→(low/medium)→(medium/–)→(low/high)→(medium/–)→(low/high)→(medium/–)→(low/high) for each step,
the gas type and flow rate of the processing gas changes over time in order of (A/B/C, α/β/γ)→(B/D, δ/ε)→(B/C/E, ζ/η/θ)♯(F/G, κ/λ)→(A/C/E, μ/ν/ξ))→(A/D, ο/π)→(B/C/E, ρ/σ/τ)→(B, υ)→(C/E/F/G, φ/χ/ψ/ω) for each step,
the ESC temperature changes over time in the order of medium→low→low→high→low→low→low→high→low for each step, and
the in-chamber pressure changes over time in the order of medium→high→low→high→low→high→medium→high→high for each step.

In this way, the reference recipe 1 is formed by a combination of the change patterns of the four control parameters. Hereinafter, the same applies to the reference recipe 2, the reference recipe 3, . . . , and the combinations of control parameters in some steps are different from the reference recipe 1.

<Specific Example of First Learning Data>

Next, a specific example of the first learning data stored in the first learning data storage unit 360 will be described. FIG. 7 is a diagram illustrating a specific example of first learning data.

As illustrated in FIG. 7, the first learning data stored in the first learning data storage unit 360 includes first learning data (input data) 710 and first learning data (correct data) 720.

Further, as illustrated in FIG. 7, the first learning data (input data) 710 includes, as information items, "device specification", "device state", "structural data", "cross-sectional image data", and "recipe". The details of the information stored in the columns corresponding to the respective information items have been described, and thus descriptions thereof will be omitted.

Further, as illustrated in FIG. 7, the first learning data (correct data) 720 includes, as information items, "step 1" to "step 9," which are the respective steps of the reference recipe 1. Further, the cross-sectional image data obtained by photographing the cross-section of the substrate at the end of each step is stored in the column corresponding to each of the information items of "step 1" to "step 9".

<Process of First Learning Unit>

Figure 8:
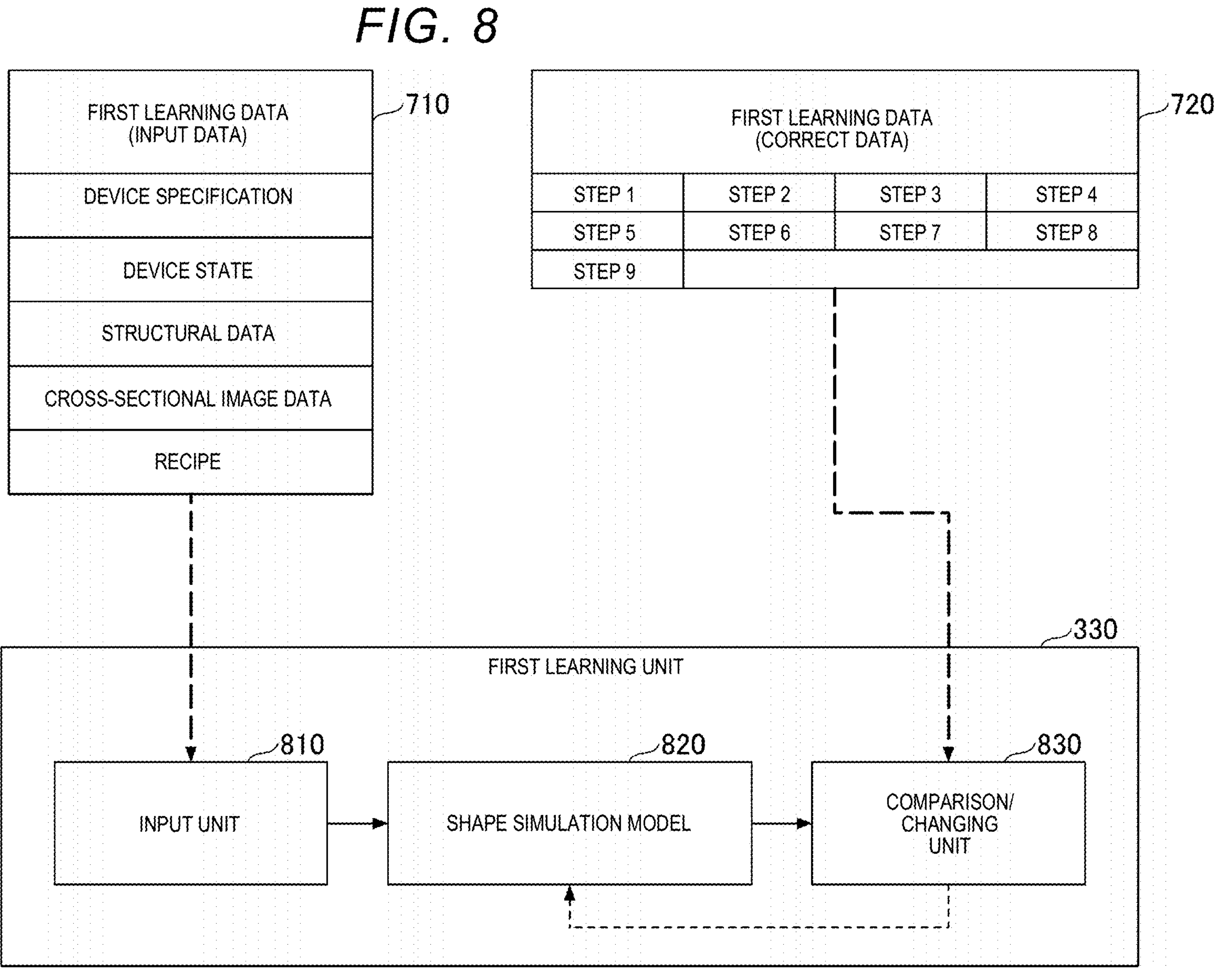
FIG. 8 is a diagram illustrating details of the process of a first learning unit.

Next, the details of the process performed by the first learning unit 330 will be described. FIG. 8 is a diagram illustrating details of the process of a first learning unit. As illustrated in FIG. 8, the first learning unit 330 includes an input unit 810, a shape simulation model 820, and a comparison/changing unit 830.

The input unit 810 reads the first learning data (input data) from the first learning data storage unit 360, and inputs the first learning data (input data) into the shape simulation model 820. The example of FIG. 8 illustrates a state where the input unit 810 reads first learning data (input data) 710 and inputs the first learning data (input data) 710 into the shape simulation model 820.

The shape simulation model 820 outputs the output data in a case of receiving the input data. Specifically, the output data (data corresponding to the cross-sectional image data)

corresponding to the number of steps ("9" in the case of reference recipe 1) included in the recipe of the first learning data (input data) is output.

The comparison/changing unit 830 reads out the first learning data (correct data) from the first learning data storage unit 360. The example of FIG. 8 illustrates a state where the comparison/changing unit 830 reads out the first learning data (correct data) 720.

Further, the comparison/changing unit 830 compares the cross-sectional image data of each step of the read first learning data (correct data) 720 with the output data of the corresponding step output from the shape simulation model 820.

The comparison/changing unit 830 updates the model parameters of the shape simulation model 820 based on the comparison results.

The first learning unit 330 executes the above-described process with respect to all the first learning data (the input data and the correct data) stored in the first learning data storage unit 360 to generate the learned shape simulation model.

<Specific Examples of Second Learning Data

Next, a specific example of the second learning data stored in the second learning data storage unit 370 will be described. FIG. 9 is a diagram illustrating a specific example of second learning data.

As illustrated in FIG. 9, the second learning data stored in the second learning data storage unit 370 includes second learning data (input data) 910 and second learning data (correct data) 920.

Further, as illustrated in FIG. 9, the second learning data (input data) 910 includes, as information items, "device specification", "device state", and "recipe". The details of the information stored in the columns corresponding to the respective information items have been described, and thus descriptions thereof will be omitted.

Further, as illustrated in FIG. 9, the second learning data (correct data) 920 includes, as information items, the "deposition amount" and the "degree of damage to the inner wall". The details of the information stored in the columns corresponding to the respective information items have been described, and thus descriptions thereof will be omitted.

<Process of Second Learning Unit>

Figure 10:
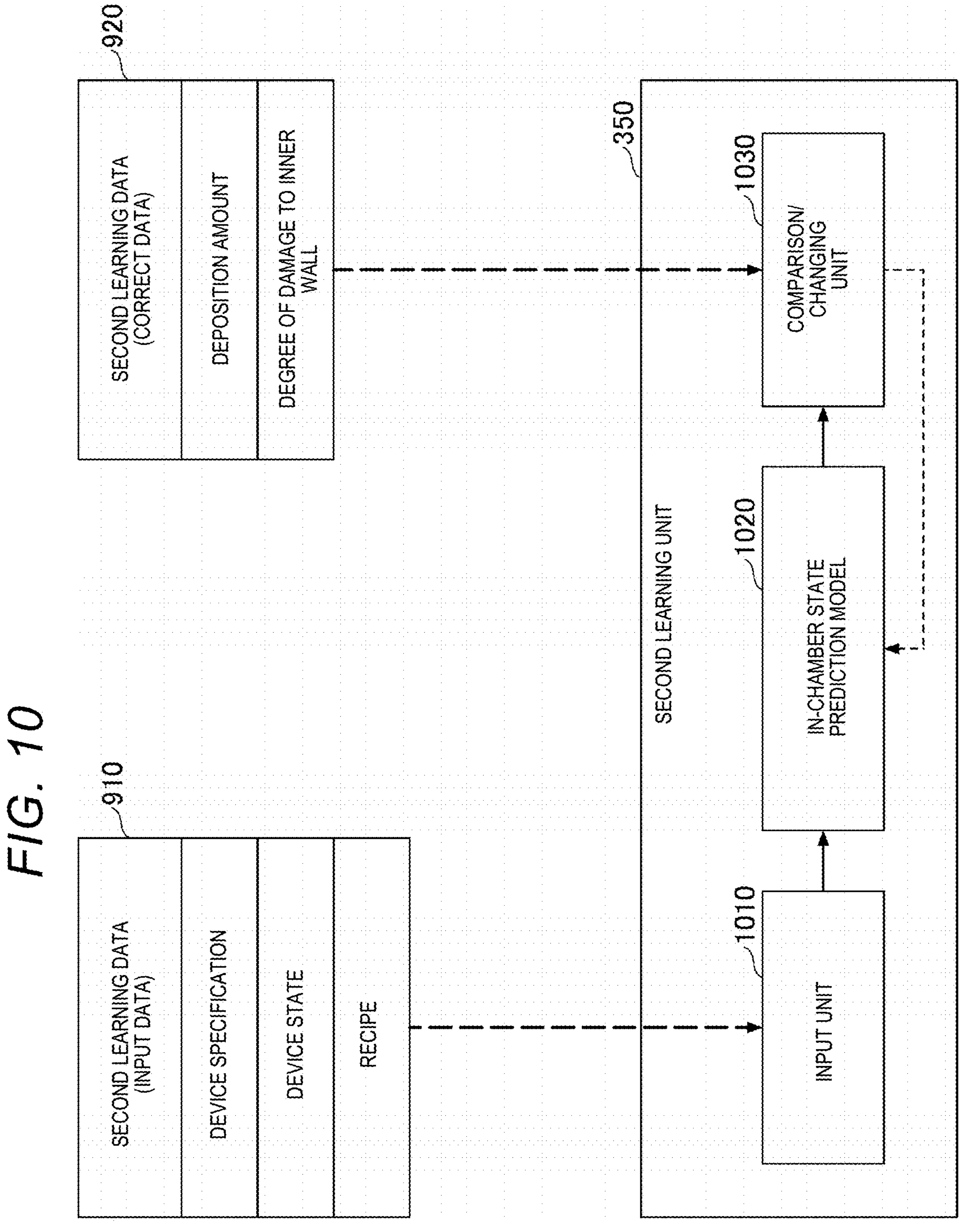
FIG. 10 is a diagram illustrating details of the process of a second learning unit.

Next, the details of the process performed by the second learning unit 350 will be described. FIG. 10 is a diagram illustrating details of the process of a second learning unit. As illustrated in FIG. 10, the second learning unit 350 includes an input unit 1010, an in-chamber state prediction model 1020, and a comparison/changing unit 1030.

The input unit 1010 reads the second learning data (input data) from the second learning data storage unit 370, and inputs the second learning data (input data) into the in-chamber state prediction model 1020. The example of FIG. 10 illustrates a state in which the input unit 1010 reads the second learning data (input data) 910 and inputs the second learning data (input data) 910 into the in-chamber state prediction model 1020.

When the input data is input, the in-chamber state prediction model 1020 outputs the output data. Specifically, the in-chamber state prediction model 1020 outputs data corresponding to the amount of deposition and data corresponding to the degree of damage to the inner wall.

The comparison/changing unit 1030 reads the second learning data (correct data) from the second learning data storage unit 370. The example of FIG. 10 illustrates a state where the comparison/changing unit 1030 reads the second learning data (correct data) 920.

Further, the comparison/changing unit 1030 compares the read second learning data (correct data) 920 with the corresponding output data output from the in-chamber state prediction model 1020.

The comparison/changing unit 1030 updates the model parameters of the in-chamber state prediction model 1020 based on the comparison results.

The second learning unit 350 executes the above-described process with respect to all the second learning data (input data, correct data) stored in the second learning data storage unit 370, thereby generating a learned in-chamber state prediction model.

<System Configuration of Plasma Processing System>

Figure 11:
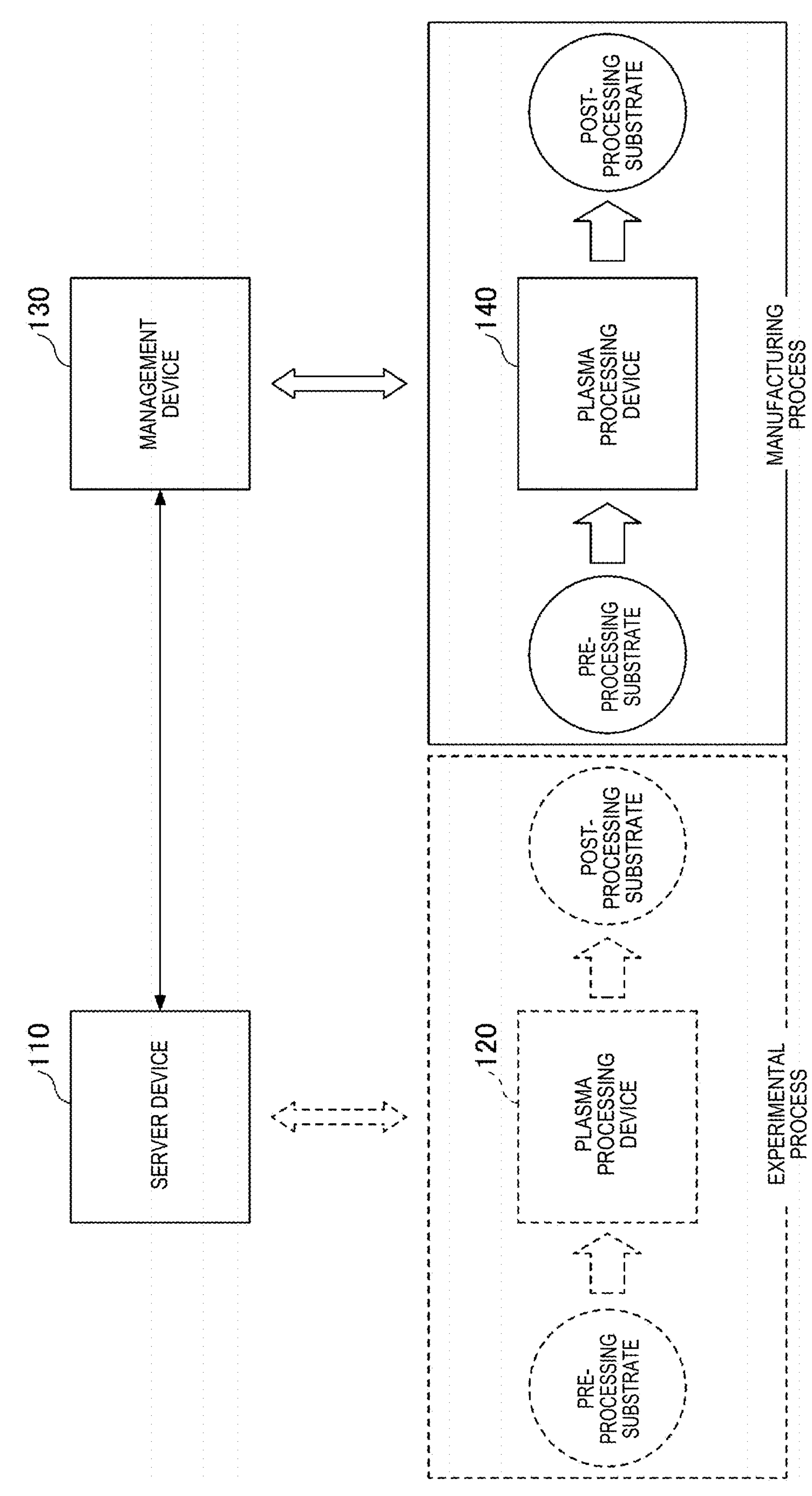
FIG. 11 is a diagram illustrating an example of the system configuration of the plasma processing system in a prediction phase.

Next, the system configuration of the plasma processing system 100 in the prediction phase will be described. FIG. 11 is a diagram illustrating an example of the system configuration of the plasma processing system in the prediction phase. As illustrated in FIG. 11, the plasma processing system 100 in the prediction phase includes the server device 110, the management device 130, and the manufacturing process.

As described above, the assistance program is installed in the server device 110. However, in the case of the prediction phase, the program is executed, so that the server device 110 generates optimal recipes and operating condition information for assisting the improvement of the processing performance of the plasma processing device 140 in the manufacturing process, and provides them to the management device 130.

Specifically, the server device 110 acquires information necessary for generating the optimal recipe from the management device 130, thereby generating the optimal recipe. Further, the server device 110 determines the operating conditions for applying the generated optimal recipe to the plasma processing device 140, and transmits the determined operating conditions, together with the optimal recipe, to the management device 130.

The management device 130 is an example of a control device. The management device 130 collects information necessary for the server device 110 to generate the optimal recipe, and transmits the information to the server device 110. Further, the management device 130 receives the optimal recipes and the operating condition information from the server device 110 in response to the collected information being transmitted to the server device 110. Further, the management device 130 operates the plasma processing device 140 based on the received operating condition information, and causes the plasma processing device 140 to execute the etching process based on the received optimal recipe.

In this way, the plasma processing device 140 can perform the etching process with high etching performance. Further, the management device 130 can appropriately operate the plasma processing device 140 to maintain high etching performance.

In this way, the plasma processing system 100 according to the first embodiment can assist the improvement of the etching performance of the plasma processing device 140.

<Functional Configurations of Server Device and Management Device in Prediction Phase>

Next, the functional configurations of the server device 110 and the management device 130 in the prediction phase will be described. FIG. 12 is a first diagram illustrating an example of the functional configurations of a server device and a management device in the prediction phase.

As illustrated in FIG. 12, in the prediction phase, the server device 110 functions as a recipe generator 1210, an input unit 1211, an operating condition determination unit 1220, and an output unit 1221.

The input unit 1211 acquires information 1201 and 1202 necessary for generating an optimal recipe from the management device 130. As illustrated in FIG. 12, the information 1201 and 1202 necessary for generating the optimal recipe include device specifications, device states, structural data, cross-sectional image data, and required shape data, each of which is described in detail below.

Device specification: Identifier for identifying the type of the plasma processing device 140

Device state: RF integration time of the plasma processing device 140

Structural data: Data related to the structure of the pre-processing substrate on which the etching process is performed by the plasma processing device 140, specifically:

Identifier indicating the pattern structure (perfectly circular hole/elliptical hole, trench structure)

Type of mask material

Type of etched film material (monolayer film or laminated film)

ADI CD dimension (After Development Inspection (ADI))

Film thickness

Opening rate

Cross-sectional image data: Image data obtained by photographing the cross-section of the pre-processing substrate on which the etching process is performed by the plasma processing device 140

Required shape data: Data required by the side of the management device 130 as data related to the shape (substrate shape) of the post-processing substrate Etching rate AEI CD dimension (After Etch Inspection (AEI))

Mask film scraping amount

Underlayer scraping amount

Uniformity

In one example, the input unit 1211 is configured to acquire first to fourth inputs as input data. The first input relates to the structure of the pre-processing substrate. The second input relates to the required shape of the post-processing substrate. A third input relates to the specifications of the plasma processing device. The fourth input relates to the state of the plasma processing device.

The recipe generator 1210 is an example of a first determination unit and includes a learned shape simulation model generated in the learning phase. The recipe generator 1210 inputs the information 1201 necessary for generating an optimal recipe based on the recipe candidates, thereby executing the learned shape simulation model and predicting the shape data of the post-processing substrate.

Further, the recipe generator 1210 determines whether the predicted shape data of the post-processing substrate matches the required shape data (whether to be in the allowable range), and, when it is determined that the shape data does not match, causes the learned shape simulation model to be executed based on the other recipe candidates.

The recipe generator 1210 searches for an optimal recipe by repeating the above-described process until the predicted shape data of the post-processing substrate matches the required shape data (until the data falls within the allowable range). Further, the recipe generator 1210 notifies the operating condition determination unit 1220 of the searched optimal recipes, and notifies the output unit 1221 of data (such as optimal recipes etc. 1203) that includes the searched optimal recipes.

The operating condition determination unit 1220 is an example of a second determination unit and includes a learned in-chamber state prediction model generated in the learning phase. The operating condition determination unit 1220 inputs the notified optimal recipe, thereby executing the learned in-chamber state prediction model and determining operating condition information 1204 that affects the processing performance of the plasma processing device 140. Further, the operating condition determination unit 1220 notifies the determined operating condition information 1204 to the output unit 1221.

The output unit 1221 transmits the optimal recipes etc. 1203 and the operating condition information 1204 to the management device 130.

In one example, the output unit 1221 is configured to output the plurality of determined control parameters (optimal recipes) and the determined operating conditions to the management device 130. The process controller 1240 of the management device 130 is configured to control the plasma processing device 140 to process the pre-processing substrate based on the plurality of determined control parameters (optimal recipes) and the determined operating conditions.

A management program is installed in the management device 130, and the management device 130 functions as a request unit 1230 and a process controller 1240 when the program is executed in the prediction phase.

The request unit 1230 collects information 1201 and 1202 necessary for the server device 110 to generate an optimal recipe. Further, the request unit 1230 transmits information 1201 and 1202 necessary for generating the optimal recipe to the server device 110.

In response to the information 1201 and 1202 necessary for generating the optimal recipe being transmitted to the server device 110 by the request unit 1230, the process controller 1240 receives the optimal recipes 1203 and the operating condition information 1204 from the server device 110.

Further, the process controller 1240 displays the received optimal recipes 1203 and the operating condition information 1204 to the user of the management device 130, and notifies them to the plasma processing device 140. In this way, the management device 130 can operate the plasma processing device 140 based on the operating condition information 1204, and can cause the plasma processing device 140 to execute the etching process based on the optimal recipe.

<Process of Recipe Generator>

Next, the details of the process performed by the recipe generator 1210 will be described. FIG. 13 is a diagram illustrating details of the process of a recipe generator. As illustrated in FIG. 13, the recipe generator 1210 includes a learned shape simulation model 1310, a post-processing shape data calculation unit 1320, an error calculation unit 1330, a recipe search unit 1340, and an output unit 1350.

The learned shape simulation model 1310 predicts a plurality of pieces of cross-sectional image data by inputting information 1201 necessary for generating the optimal recipe, which is transmitted from the management device 130 and acquired by the input unit 1211, together with recipe candidates. The number of pieces of cross-sectional image data output from the learned shape simulation model 1310 corresponds to the number of steps included in the recipe candidates, and each piece of cross-sectional image data corresponds to the cross-sectional image data at the end of each of the steps included in the recipe candidates.

The post-processing shape data calculation unit 1320 acquires cross-sectional image data corresponding to the cross-sectional image data at the end of the last step included in the recipe candidates among the plurality of cross-sectional image data predicted by the learned shape simulation model 1310. The cross-sectional image data corresponding to the cross-sectional image data at the end of the last step included in the recipe candidate is cross-sectional image data of the post-processing substrate.

Further, the post-processing shape data calculation unit 1320 calculates post-processing shape data based on the acquired cross-sectional image data of the post-processing substrate. Specifically, the post-processing shape data calculation unit 1320 calculates, as the post-processing shape data, Etching rate, AEI CD dimension, Mask film scraping amount, Underlayer scraping amount, and Uniformity.

Further, the post-processing shape data calculation unit 1320 notifies the error calculation unit 1330 of the calculated post-processing shape data.

As illustrated in FIG. 13, the learned shape simulation model 1310 and the post-processing shape data calculation unit 1320 form a first prediction unit.

The error calculation unit 1330 compares the post-processing shape data notified from the post-processing shape data calculation unit 1320 with the required shape data included in the information 1202 necessary for generating the optimal recipe transmitted from the management device 130 and acquired by the input unit 1211, thereby calculating an error.

Further, the error calculation unit 1330 determines whether or not the calculated error is equal to or lower than a threshold value, and, when it is determined that the calculated error is not equal to or lower than a predetermined threshold value, the error calculation unit 1330 notifies the recipe search unit 1340 of the calculated error.

Further, in a case of determining that the calculated error is equal to or lower than the threshold value, the error calculation unit 1330 notifies the output unit 1350 of the post-processing shape data.

The recipe search unit 1340 inputs recipe candidates into the learned shape simulation model 1310. Further, in a case where the error is notified from the error calculation unit 1330, the recipe search unit 1340 selects the recipe candidates to reduce the error (however, selects the recipe candidates different from the recipe candidates input into the learned shape simulation model 1310). Further, the recipe search unit 1340 inputs the selected recipe candidates into the learned shape simulation model 1310. The recipe search unit 1340 holds the combinations of the plurality of control parameters described above (see FIG. 5), and selects recipe candidates by assigning any of the plurality of control parameters to each step.

In a case where the post-processing shape data is notified from the error calculation unit 1330, the output unit 1350 acquires the plurality of corresponding cross-sectional image data from the post-processing shape data calculation unit 1320, and acquires the corresponding recipe candidates as the optimal recipes from the recipe search unit 1340.

Further, the output unit 1350 transmits the acquired optimal recipes, the plurality of cross-sectional image data, and the post-processing shape data to the management device 130 via the output unit 1221 as the optimal recipes 1203. Further, the output unit 1350 notifies the acquired optimal recipes to the operating condition determination unit 1220.

In one example, the first determination unit (recipe generator 1210) is configured to determine, based on the input data that includes the first to fourth inputs, a plurality of control parameters for processing a pre-processing substrate so that the predicted shape of the post-processing substrate conforms to the required shape of the post-processing substrate, using the first machine learning model (the learned shape simulation model 1310).

Each of the plurality of control parameters (recipe candidates) has a plurality of states that change over time. The plurality of control parameters (recipe candidates) include the first to fifth control parameters. The first control parameter relates to the temporal change in the power level of the source RF signal. The second control parameter relates to the temporal change in the power level of the bias signal. The third control parameter relates to the temporal change in the type and flow rate of the at least one processing gas. The fourth control parameter relates to a temporal change in temperature of at least one heating element in the substrate support. The fifth control parameter relates to the temporal change in the pressure in the plasma processing chamber.

<Specific Examples of Optimal Recipes>

Next, a description will be given with respect to a specific example of the optimal recipes 1203 (for example, the optimal recipes, a plurality of cross-sectional image data, and post-processing shape data) transmitted from the output unit 1350 to the management device 130. FIG. 14 is a diagram illustrating examples of the optimal recipe, the plurality of cross-sectional image data, and the post-processing shape data.

The example of FIG. 14 illustrates a state where an optimal recipe 1410 which includes "step 1" to "step 9" and in which the change patterns of the four control parameters are combined is searched and transmitted. Further, the example of FIG. 14 illustrates a state where cross-sectional image data 1411 is predicted and transmitted as the cross-sectional image data of the substrate at the end of each of the steps "step 1" to "step 9".

According to the cross-sectional image data of the substrate at the end of each step included in the cross-sectional image data 1411, for example, the following can be inferred.

- According to the cross-sectional image data at the end of step 1, it can be inferred that the descum process (the process of removing the scum) is appropriately performed by the combination of the control parameters of step 1 of the optimal recipe 1410.
- According to the cross-sectional image data at the end of step 2, it can be inferred that the mask protective film is appropriately formed by the combination of the control parameters of step 2 of the optimal recipe 1410.
- According to the cross-sectional image data at the end of step 3, it can be inferred that the etching process is appropriately performed at the position where the aspect ratio is low, by the combination of the control parameters of step 3 of the optimal recipe 1410.
- According to the cross-sectional image data at the end of step 4, it can be inferred that the sidewall protective film is appropriately formed by the combination of the control parameters of step 4 of the optimal recipe 1410.
- According to the cross-sectional image data at the end of step 5, it can be inferred that the etching process at the position where the aspect ratio is moderate (without the sidewall swelling) is appropriately performed by the combination of the control parameters of step 5 of the optimal recipe 1410.

According to the cross-sectional image data at the end of step 6, it can be inferred that the mask protective film is appropriately formed by the combination of the control parameters of step 6 of the optimal recipe 1410.

According to the cross-sectional image data at the end of step 7, it can be inferred that the etching process at the position where the aspect ratio is high (without the sidewall swelling) is appropriately performed by the combination of the control parameters of step 7 of the optimal recipe 1410.

According to the cross-sectional image data at the end of step 8, it can be inferred that the sidewall protective film is appropriately formed by the combination of the control parameters of step 8 of the optimal recipe 1410.

According to the cross-sectional image data at the end of step 9, it can be inferred that the etching process is finally appropriately performed (which matches the required shape data) by the combination of the control parameters of step 9 of the optimal recipe 1410.

Further, the example of FIG. 14 illustrates a state where post-processing shape data 1420 that includes the "etching rate", "AEI CD dimensions", "mask film scraping amount", "underlayer film scraping amount", and "uniformity" is calculated and transmitted as the information items. In this way, the user of the management device 130 can quantitatively recognize that the post-processing shape data that matches the required shape data can be realized.

<Process of Operating Condition Determination Unit>

Next, the details of the process performed by the operating condition determination unit 1220 will be described. FIG. 15 is a diagram illustrating details of the process of the operating condition determination unit. As illustrated in FIG. 15, the operating condition determination unit 1220 includes a learned in-chamber state prediction model 1510 and a determination unit 1520.

The optimal recipe notified from the recipe generator 1210, and the device specification and the device state are input into the learned in-chamber state prediction model 1510. In this way, the learned in-chamber state prediction model 1510 predicts the amount of deposition and the degree of damage to the inner wall in the plasma processing chamber at the end of the etching process in a case where the etching process is executed based on the optimal recipes. As illustrated in FIG. 15, the learned in-chamber state prediction model 1510 forms a second prediction unit.

The determination unit 1520 determines cleaning conditions for Wafer Less Dry Cleaning (WLDC) based on the deposition amount predicted by the learned in-chamber state prediction model 1510. The cleaning conditions include the type of the cleaning gas, the cleaning frequency, the cleaning time, and the cleaning intensity (see reference numeral 1531).

Further, the determination unit 1520 determines pre-coating conditions (coating conditions) for the inner wall of the plasma processing chamber, based on the degree of damage to the inner wall predicted by the learned in-chamber state prediction model 1510. The pre-coating conditions include the type of pre-coating gas (coating gas), the pre-coating frequency (coating frequency), the pre-coating time (coating time), and the pre-coating intensity (coating intensity) (see reference numeral 1532).

Further, the determination unit 1520 transmits the determined cleaning conditions and coating conditions to the management device 130 via the output unit 1221 as the operating condition information 1204.

In one example, the second determination unit (the operating condition determination unit 1220) is configured to determine the operating condition of the plasma processing device using the second machine learning model (the learned in-chamber state prediction model 1510) based on the plurality of determined control parameters (the optimal recipes), the third input, and the fourth input. The operating conditions include the cleaning condition and/or the coating condition for the plasma processing chamber.

<Flow of Assistance Process>

Figure 16:
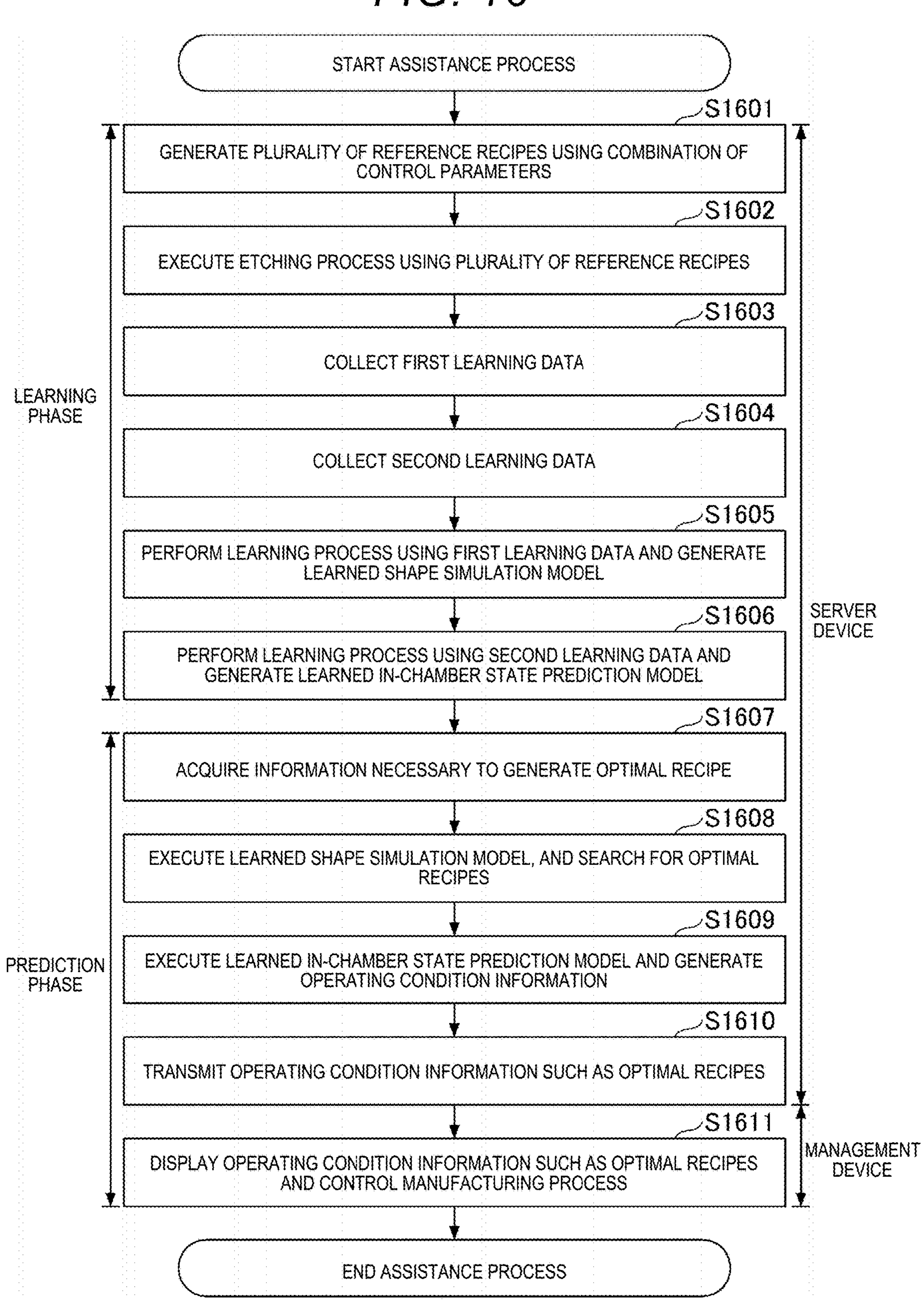
FIG. 16 is a first flowchart illustrating the flow of an assistance process.

Next, the overall flow of the assistance process performed by the plasma processing system 100 will be described. FIG. 16 is a first flowchart illustrating the flow of an assistance process.

In step S1601, the server device 110 generates a plurality of reference recipes based on a combination of the change patterns obtained by changing each of the plurality of control parameters over time.

In step S1602, the server device 110 notifies the plasma processing device of the experimental process of the plurality of reference recipes, and causes the plasma processing device to execute the etching process.

In step S1603, the server device 110 collects the first learning data corresponding to each of the plurality of reference recipes.

In step S1604, the server device 110 collects the second learning data corresponding to the plurality of reference recipes.

In step S1605, the server device 110 performs the learning process using the first learning data to generate a learned shape simulation model.

In step S1606, the server device 110 performs a learning process using the second learning data to generate the learned in-chamber state prediction model.

In step S1607, the server device 110 acquires information necessary to generate the optimal recipes for the plasma processing device in the manufacturing process.

In step S1608, the server device 110 uses the information necessary to generate the optimal recipes, and executes the learned shape simulation model, thereby searching for the optimal recipes.

In step S1609, the server device 110 executes the learned in-chamber state prediction model using the optimal recipes, and generates the operating condition information.

In step S1610, the server device 110 transmits the optimal recipes and the operating condition information to the management device 130.

In step S1611, the management device 130 displays the optimal recipes and the operating condition information, and provides notification to the plasma processing device 140, thereby controlling the manufacturing process.

<Summary>

As is clear from the above descriptions, the plasma processing system 100 according to the first embodiment performs:

Predicting, using the learned shape simulation model, the shape data of a post-processing substrate when the etching process is performed by changing each of the plurality of control parameters that affect processing performance over time;

Searching the shape data of the post-processing substrate predicted by the learned shape simulation model for the optimal recipe that becomes the required shape data;

Predicting, using the learned in-chamber state prediction model, the amount of deposition and the degree of damage to the inner wall in the plasma processing chamber after the etching process is performed from the searched optimal recipes;

Determining, operating conditions in a case of performing the etching process based on the optimal recipe as the operating conditions that affect processing performance. Specifically, the operating conditions are determined from the amount of deposition and the degree of damage to the inner wall in the plasma processing chamber after the etching process predicted by the learned in-chamber state prediction model; and Displaying the optimal recipes and the operating conditions are displayed. Further, the plasma processing device in the manufacturing process is operated based on the determined operating conditions, and the etching process is executed based on the searched optimal recipe.

In this way, the plasma processing system according to the first embodiment can assist the improvement of the processing performance in the plasma processing device.

Second Embodiment

In the plasma processing system according to the first embodiment, the description is made so that the generation of the learned shape simulation model and the generation of the learned in-chamber state prediction model are executed in the server device in the learning phase.

However, the generation of the learned shape simulation model and the generation of the learned in-chamber state prediction model may be configured to be executed in the management device. Hereinafter, the second embodiment will be described with a focus on the differences from the first embodiment.

<Functional Configuration of Server Device and Management Device in Learning Phase>

First, the functional configurations of the server device and the management device in the learning phase of the plasma processing system according to the second embodiment will be described. FIG. 17 is a first diagram illustrating an example of the functional configurations of the server device and the management device in the learning phase.

The functional configuration of a server device 1710 illustrated in FIG. 17 is different from the functional configuration of the server device 110 illustrated in FIG. 3 in that the first learning unit 330 and the second learning unit 350 are not included in the functional configuration of the server device 1710 illustrated in FIG. 17.

Further, in the plasma processing system according to the first embodiment, the management device 130 does not function in the learning phase. In contrast, in the plasma processing system according to the second embodiment, the management device 130 functions as the first learning unit 330 and the second learning unit 350 in the learning phase.

<Functional Configuration of Management Device in Prediction Phase>

Next, the functional configuration of the management device in the prediction phase of the plasma processing system according to the second embodiment will be described. FIG. 18 is a diagram illustrating an example of the functional configuration of the management device in the prediction phase.

In the plasma processing system according to the first embodiment, the server device 110 functions as the recipe generator 1210 and the operating condition determination unit 1220 (see, FIG. 12). On the other hand, in the plasma processing system according to the second embodiment, the server device 1710 does not function in the prediction phase. The functional configuration of the server device is thus omitted in FIG. 18.

The functional configuration of a management device 1730 illustrated in FIG. 18 is different from the functional configuration of the management device 130 illustrated in FIG. 12 in that the functional configuration of the management device 1730 illustrated in FIG. 18 includes the recipe generator 1210, the input unit 1211, the operating condition determination unit 1220, and the output unit 1221.

In this way, the plasma processing system according to the second embodiment has a configuration in which the management device 1730 includes the first learning unit 330 and the second learning unit 350. In this way, the plasma processing system according to the second embodiment eliminates the need to transmit and receive information between the server device 1710 and the management device 1730 in the prediction phase. In other words, the management device 1730 can generate the optimal recipe for realizing shape data of the post-processing substrate that matches the required shape data, and operating condition information used in a case where the optimal recipe is applied to the plasma processing device 140.

<Flow of Assistance Process>

Next, the overall flow of the assistance process performed by the plasma processing system according to the second embodiment will be described. FIG. 19 is a second flowchart illustrating the flow of the assistance process. The first embodiment is different from the first flowchart illustrated in FIG. 16 in that the processing details of steps S1901 and S1902 are different from the processing details of steps S1603 and S1604, and the process of step S1610 is not included. Further, the difference from the first flowchart illustrated in FIG. 16 is that the execution subject of the process of steps S1605 to S1609 is the management device.

In step S1901, the server device 1710 collects the first learning data corresponding to each of the plurality of reference recipes, and transmits the collected data to the management device 1730.

In step S1902, the server device 1710 collects the second learning data corresponding to each of the plurality of reference recipes, and transmits the collected data to the management device 1730.

<Summary>

As is clear from the above description, the plasma processing system according to the second embodiment has the same functions as in the first embodiment described above, and is configured to dispose the first learning unit and the second learning unit functioning in the learning phase in the management device; and dispose the recipe generator and the operating condition determination unit functioning in the prediction phase in the management device.

In this way, with the plasma processing system according to the second embodiment, the same effects as in the first embodiment can be obtained, and the optimal recipe and the operating condition information can be generated by the management device.

In the above description, the first learning unit and the second learning unit functioning in the learning phase are disposed in the management device. However, a configuration may be provided that the first learning unit and the second learning unit are disposed in the server device and the learned shape simulation model and the learned in-chamber state prediction model are transmitted to the management device (see FIG. 20). In this case as well, the same effect as described above can be obtained.

Figure 20:
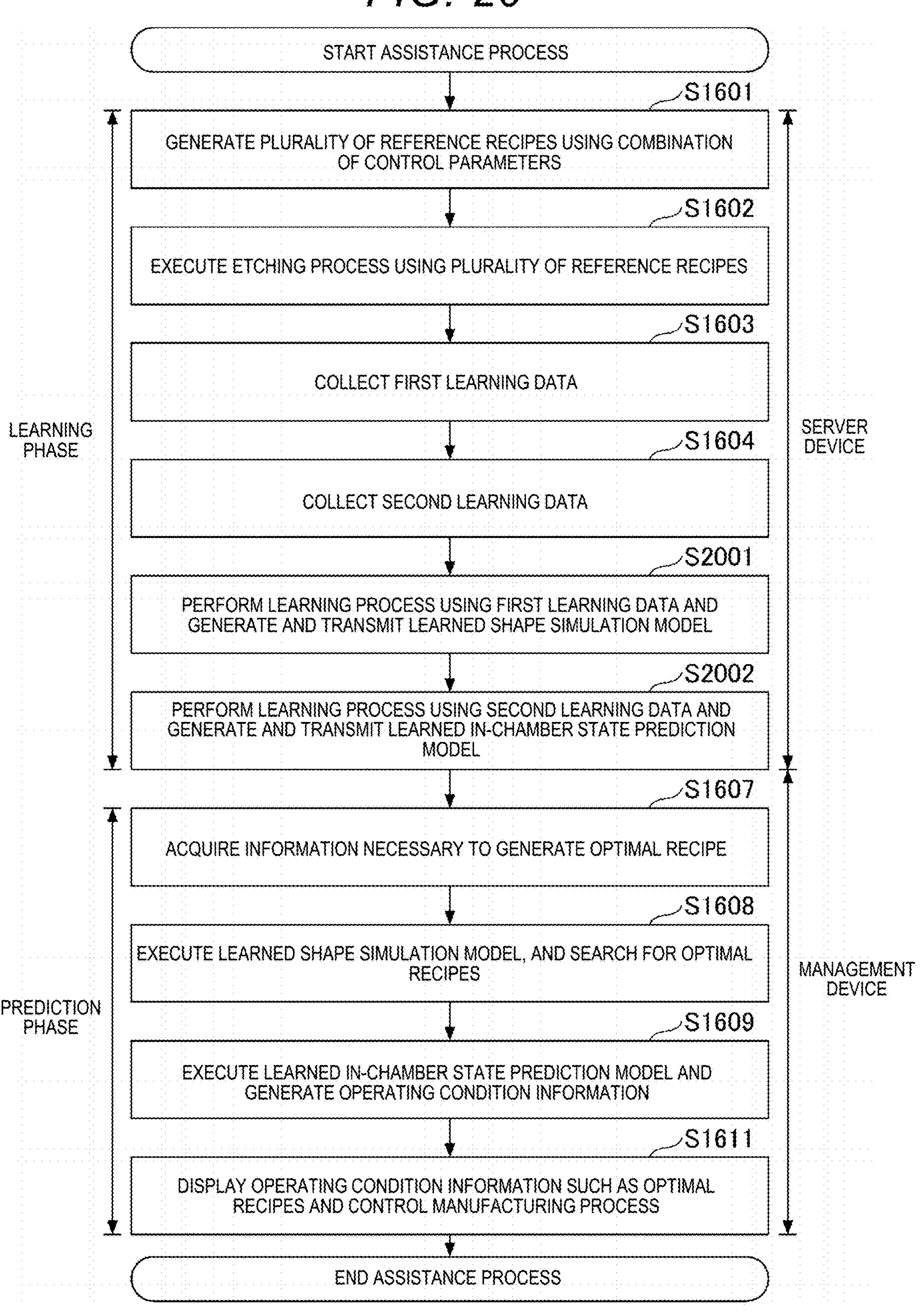
FIG. 20 is a third flowchart illustrating the flow of the assistance process.

FIG. 20 is a third flowchart illustrating the flow of the assistance process. In the case of the assistance process illustrated in FIG. 20, in step S2001, the server device generates the learned shape simulation model, and transmits the generated learned shape simulation model to the management device. Further, in step S2002, the server device generates the learned in-chamber state prediction model, and transmits the learned in-chamber state prediction model to the management device. In this way, the management device can generate the optimal recipes and the operating condition information.

Third Embodiment

The plasma processing system of the second embodiment has been described with respect to a configuration in which the first learning data collection unit and the second learning data collection unit functioning in the learning phase are disposed in the server device.

However, the first learning data collection unit and the second learning data collection unit functioning in the learning phase may be disposed in the management device. Hereinafter, the third embodiment will be described with a focus on the differences from the second embodiment.

<Functional Configuration of Server Device and Management Device in Learning Phase>

Figure 21:
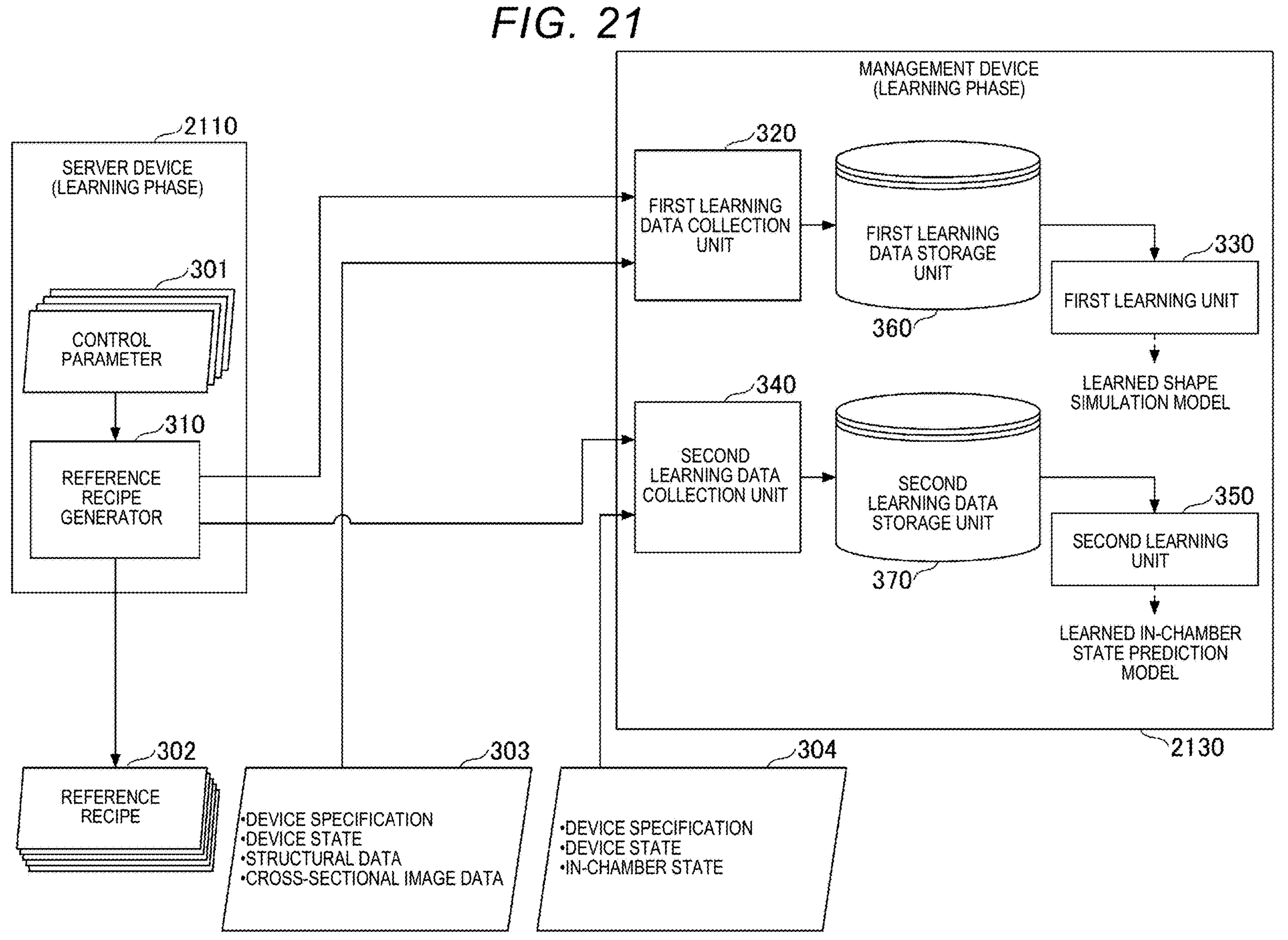
FIG. 21 is a second diagram illustrating an example of the functional configurations of the server device and the management device in the learning phase.

First, the functional configurations of the server device and the management device in the learning phase of the plasma processing system according to the third embodiment will be described. FIG. 21 is a second diagram illustrating an example of the functional configurations of the server device and the management device in the learning phase.

The functional configuration of a server device 2110 illustrated in FIG. 21 is different from the functional configuration of the server device 1710 illustrated in FIG. 17 in that, in the functional configuration of the server device 2110 illustrated in FIG. 21, the first learning data collection unit 320 and the second learning data collection unit 340 are not included.

Further, the functional configuration of a management device 2130 illustrated in FIG. 21 is different from the functional configuration of the management device 1730 illustrated in FIG. 17 in that, in the functional configuration of the management device 2130 illustrated in FIG. 21, the first learning data collection unit 320 and the second learning data collection unit 340 are included.

With the configuration in which the first learning data collection unit 320 and the second learning data collection unit 340 are disposed in the management device 2130, the first learning data storage unit 360 and the second learning data storage unit 370 are also realized in the management device 2130, as illustrated in FIG. 21.

In this way, by providing a configuration in which the first learning data collection unit 320 and the second learning data collection unit 340 are disposed in the management device 2130, the management device 2130 can newly collect the first learning data and the second learning data in a case where the etching process is executed in the plasma processing device 140 in the manufacturing process and can learn again, using the newly collected first learning data and second learning data, the learned shape simulation model and the learned in-chamber state prediction model.

In other words, according to the plasma processing system of the third embodiment, by executing the etching process in the plasma processing device 120 of the experimental process, the shape simulation model and the in-chamber state prediction model can be learned using the first learning data and the second learning data collected. Additionally, by executing the etching process in the plasma processing device 140 in the manufacturing process, the shape simulation model and the in-chamber state prediction model can be learned again using the newly collected first learning data and second learning data.

<Flow of Assistance Process>

Next, the overall flow of the assistance process performed by the plasma processing system according to the third embodiment will be described. FIG. 22 is a fourth flowchart illustrating the flow of the assistance process. The second embodiment described above is different from the second flowchart illustrated in FIG. 19 in that the processing details of step S2201 are different from the processing details of step S1602, and that the execution subject of the process of steps S1603 to S1604 is the management device. Further, the fourth flowchart illustrated in FIG. 22 is different from the second flowchart illustrated in FIG. 19 in that step S2202 is added.

In step S2201, the server device 2110 notifies the plasma processing device in the experimental process of the plurality of reference recipes, and causes the plasma processing device to execute the etching process. The server device 2110 transmits data 303 and 304 acquired by executing the etching process to the management device 2130 together with the reference recipe.

In step S2202, the management device 2130 determines whether to cause the learned shape simulation model and the learned in-chamber state prediction model to be learned again. When it is determined that learning is to be performed again in step S2202 (YES in step S2202), the process returns to step S1603. In this case, the first learning data is newly collected in step S1603, and the second learning data is newly collected in step S1604. Further, in step S1605, the learned shape simulation model is learned again, and in step S1606, the learned in-chamber state prediction model is learned again.

On the other hand, when it is determined that the learning is not to be performed again in step S2202 (NO in step S2202), the assistance process is ended.

<Summary>

As is clear from the above description, the plasma processing system according to the third embodiment is configured to

- have the same function as in the first embodiment described above, and
- dispose the first learning data collection unit and the second learning data collection unit functioning in the learning phase in the management device.

In this way, according to the plasma processing system of the third embodiment, the same effects as in the second embodiment can be obtained, and the shape simulation model and the in-chamber state prediction model can be learned again.

Other Embodiments

In each of the embodiments described above, as the plurality of control parameters that affect the etching surface reaction, the RF signal, the processing gas type, the ESC temperature, and the in-chamber pressure have been described. However, the control parameters that affect the etching surface reaction are not limited to the four types.

Control parameters other than the four types may be included, or any of the four types of control parameters may not be included.

Further, in the embodiments described above, 108 combinations of control parameters that can be assigned to the respective steps have been described. However, the number of combinations is not limited to 108.

For example, as a change method in a case of changing the RF signal into a pulse shape, four types of changes (HF/LF=(High/Low), (Medium/−), (Low/Medium), (Low/High)) have been described. However, the change method in a case of changing the RF signal into a pulse shape is not limited to the four types. Similarly, nine types of change methods have been described as the change method in a case of changing the gas types and flow rate of the processing gas over time. However, the change method in a case of changing the gas types and flow rate of the processing gas over time is not limited to nine types. Similarly, three types of change methods have been described as the change method in a case of changing the ESC temperature over time. However, the change method in a case of changing the ESC temperature over time is not limited to the three types. Similarly, three types of change methods have been described as the change methods of changing the in-chamber pressure over time. However, the change method in a case of changing the in-chamber pressure over time is not limited to the three types.

Further, in the embodiments described above, the information items included in the first learning data (input data) include "device specification", "device state", "structural data", "cross-sectional image data", and "recipe". However, the information items included in the first learning data (input data) are not limited thereto.

Further, in the embodiments described above, the first learning data (correct data) is used as the cross-sectional image data at the end of each step. However, the first learning data (correct data) is not limited to the cross-sectional image data, and may be other information as long as it is information indicating the shape at the end of each step.

Further, in the embodiments described above, the information items included in the second learning data (input data) include "device specification", "device state", and "recipe". However, the information items included in the second learning data (input data) are not limited thereto.

In each of the above-described embodiments, the information items included in the second learning data (for example, the correct data) include the "deposition amount" and the "degree of damage to the inner wall". However, the information item included in the second learning data (correct data) is not limited thereto, and may be other information as long as it is information indicating the state in the plasma processing chamber.

Further, in each of the embodiments, the description is made so that the learned in-chamber state prediction model predicts both the amount of deposition and the degree of damage to the inner wall. However, the model that predicts the amount of deposition and the model that predicts the degree of damage to the inner wall may be configured separately.

Further, in each of the embodiments, the case where one type of cleaning condition is determined as the cleaning condition has been described. However, as the cleaning condition, a plurality of types of cleaning conditions may be determined.

For example, in a case where the optimal recipe includes a step of forming the carbon-based protective film, a cleaning condition that uses a cleaning gas including a large amount of $O_2$ may be determined. Further, in a case where the same optimal recipe includes a step of forming a silicon-based protective film, a cleaning condition that uses a cleaning gas including a large amount of CF-based gas may be determined. In a case where a plurality of types of cleaning conditions are determined, the cleaning based on the respective cleaning conditions may be executed at the same time, or may be executed separately.

Further, in each of the embodiments, the description is made so that the plasma processing device 140 in the manufacturing process executes the optimal recipe notified from the management device in one plasma processing chamber. However, the plasma processing device 140 in the manufacturing process may execute the optimal recipe notified from the management device in a plurality of plasma processing chambers. Specifically, the plasma processing device 140 in the manufacturing process may execute some steps (for example, a step of performing etching) included in the optimal recipe in the first plasma processing chamber. Further, the plasma processing device 140 in the manufacturing process may execute other steps (for example, a step of forming a protective film) included in the optimal recipe in the second plasma processing chamber.

The embodiments disclosed above include, for example, the following aspects.

(Appendix 1)

A plasma processing system including:

a plasma processing device;

an assistance device; and a control device, in which the plasma processing device includes

- a plasma processing chamber,
- a substrate support set in the plasma processing chamber, the substrate support including at least one electrode and at least one heating element,
- a gas supply configured to supply at least one processing gas into the plasma processing chamber,
- a source RF generator configured to generate a source RF signal for forming a plasma from the at least one processing gas supplied into the plasma processing chamber, and
- a bias generator configured to supply a bias signal to the at least one electrode, the assistance device includes
- an input unit configured to acquire a first input related to a structure of a pre-processing substrate, a second input related to a required shape of a post-processing substrate, a third input related to a specification of the plasma processing device, and a fourth input related to a state of the plasma processing device,
- a first determination unit configured to determine, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, the plurality of control parameters including a first control parameter related to a temporal change of a power level of the source RF signal, a second control parameter related to a temporal change of a power level of the bias signal, a third control parameter related to a temporal change of a type and flow rate of the at least one processing gas, and a fourth control parameter related to a temporal change of a temperature of the at least one heating element, and the first machine learning model being trained in advance based on a plurality of experimental results and a plurality of simulation results, a second determination unit configured to determine, based on the plurality of determined control parameters, the third input, and the fourth input, an operating condition of the plasma processing device using a second machine learning model, the operating condition including a cleaning condition and/or a coating condition for the plasma processing chamber, and the second machine learning model being trained in advance based on a plurality of experimental results and a plurality of simulation results, and an output unit configured to output the plurality of determined control parameters and the determined operating condition to the control device, and the control device is configured to control the plasma processing device to process the pre-processing substrate based on the plurality of determined control parameters and the determined operating condition.

(Appendix 2)

In the plasma processing system according to Appendix 1, the first determination unit is configured to determine the plurality of control parameters so that a difference between the predicted shape of the post-processing substrate and the required shape of the post-processing substrate is small.

(Appendix 3)

In the plasma processing system according to Appendix 2, the first determination unit is configured to determine the plurality of control parameters in a case where the difference is within an allowable range.

(Appendix 4)

In the plasma processing system according to any one of Appendices 1 to 3, the plurality of control parameters further include a fifth control parameter related to a temporal change of pressure in the plasma processing chamber.

(Appendix 5)

In the plasma processing system according to any one of Appendices 1 to 4, the operating condition is determined based on an amount of deposits deposited on an inner wall of the plasma processing chamber after processing the pre-processing substrate or a degree of damage to the inner wall of the plasma processing chamber after processing the pre-processing substrate.

(Appendix 6)

In the plasma processing system according to any one of Appendices 1 to 5, the cleaning condition includes a type of a cleaning gas, a cleaning frequency, and a cleaning time.

(Appendix 7)

In the plasma processing system according to any one of Appendices 1 to 6, the coating condition includes a type of a coating gas, a coating frequency, and a coating time.

(Appendix 8)

The plasma processing system according to any one of Appendices 1 to 7, further including a display device, in which the output unit is configured to output the plurality of determined control parameters, the predicted shape of the post-processing substrate, and the determined operating condition to the display device.

(Appendix 9)

An assistance device including:

an input unit configured to acquire a first input related to a structure of a pre-processing substrate, a second input related to a required shape of a post-processing substrate, a third input related to a specification of a plasma processing device, and a fourth input related to a state of the plasma processing device;

a first determination unit configured to determine, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, and the first machine learning model being trained in advance based on a plurality of experimental results and a plurality of simulation results;

a second determination unit configured to determine, based on the plurality of determined control parameters, the third input, and the fourth input, an operating condition of the plasma processing device using a second machine learning model, the operating condition including a cleaning condition and/or a coating condition for a chamber included in the plasma processing device, and the second machine learning model being trained in advance based on a plurality of experimental results and a plurality of simulation results; and an output unit configured to output the plurality of determined control parameters and the determined operating condition.

(Appendix 10)

An assistance method causing a computer to execute:

acquiring a first input related to a structure of a pre-processing substrate, a second input related to a required shape of a post-processing substrate, a third input related to a specification of a plasma processing device, and a fourth input related to a state of the plasma processing device;

determining, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, and the first machine learning model being trained in advance based on a plurality of experimental results and a plurality of simulation results;

determining, based on the plurality of determined control parameters, the third input, and the fourth input, an operating condition of the plasma processing device using a second machine learning model, the operating condition including a cleaning condition and/or a coating condition for a chamber included in the plasma processing device, and the second machine learning model being trained in advance based on a plurality of experimental results and a plurality of simulation results; and outputting the plurality of determined control parameters and the determined operating condition.

(Appendix 11)

An assistance program causing a computer to execute:

acquiring a first input related to a structure of a pre-processing substrate, a second input related to a required shape of a post-processing substrate, a third input related to a specification of a plasma processing device, and a fourth input related to a state of the plasma processing device;

determining, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, and the first machine learning model being trained in advance based on a plurality of experimental results and a plurality of simulation results;

determining, based on the plurality of determined control parameters, the third input, and the fourth input, an operating condition of the plasma processing device using a second machine learning model, the operating condition including a cleaning condition and/or a coating condition for a chamber included in the plasma processing device, and the second machine learning model being trained in advance based on a plurality of experimental results and a plurality of simulation results; and outputting the plurality of determined control parameters and the determined operating condition.

The present invention is not limited to the configurations described in connection with the embodiments that have been described heretofore, or to the combinations of these configurations with other elements. Various variations and modifications may be made without departing from the scope of the present invention, and may be adopted according to applications.

This application claims the benefit of Japanese Patent Application No. 2022-113776, filed Jul. 15, 2022, which is hereby incorporated by reference in its entirety.

The invention claimed is:

1. A plasma processing system comprising:

a plasma processing device;

an assistance device including a processor and memory including a computer readable program stored executable by the processor; and a control device, wherein the plasma processing device includes a plasma processing chamber, a substrate support disposed in the plasma processing chamber, the substrate support including at least one electrode and at least one heating element, a gas supply configured to supply at least one processing gas into the plasma processing chamber, a source RF generator configured to generate a source RF signal for forming a plasma from the at least one processing gas supplied into the plasma processing chamber, and a bias generator configured to supply a bias signal to the at least one electrode, the assistance device includes an input unit configured to acquire a first input related to a structure of a pre-processing substrate, a second input related to a required shape of a post-processing substrate, a third input related to a specification of the plasma processing device, and a fourth input related to a state of the plasma processing device, a first determination unit configured to determine, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, the plurality of control parameters including a first control parameter related to a temporal change of a power level of the source RF signal, a second control parameter related to a temporal change of a power level of the bias signal, a third control parameter related to a temporal change of a type and flow rate of the at least one processing gas, and a fourth control parameter related to a temporal change of a temperature of the at least one heating element, the first machine learning model being trained in advance based on a plurality of experimental results and a plurality of simulation results, a second determination unit configured to determine, based on the determined control parameters, the third input, and the fourth input, an operating condition of the plasma processing device using a second machine learning model, the operating condition including a cleaning condition and/or a coating condition for the plasma processing chamber, the second machine learning model being trained in advance based on a plurality of experimental results and a plurality of simulation results, and an output unit configured to output the determined control parameters and the determined operating condition to the control device, and the control device is configured to control the plasma processing device to process the pre-processing substrate based on the determined control parameters and the determined operating condition.

2. The plasma processing system according to claim 1, wherein the first determination unit is configured to determine whether the predicted shape of the post-processing substrate matches the required shape.

3. The plasma processing system according to claim 2, wherein the first determination unit is configured to determine the plurality of control parameters in a case where the difference is within an allowable range.

4. The plasma processing system according to claim 1, wherein the plurality of control parameters further includes a fifth control parameter related to a temporal change of pressure in the plasma processing chamber.

5. The plasma processing system according to claim 1, wherein the operating condition is determined based on an amount of deposits deposited on an inner wall of the plasma processing chamber after processing the pre-processing substrate or a degree of damage to the inner wall of the plasma processing chamber after processing the pre-processing substrate.

6. The plasma processing system according to claim 1, wherein the cleaning condition includes a type of a cleaning gas, a cleaning frequency, and a cleaning time.

7. The plasma processing system according to claim 1, wherein the coating condition includes a type of a coating gas, a coating frequency, and a coating time.

8. The plasma processing system according to claim 1, further comprising:

a display device, wherein the output unit is configured to output the determined control parameters, the predicted shape of the post-processing substrate, and the determined operating condition to the display device.

9. An assistance device comprising:

a processor;

memory including a computer readable program stored executable by the processor;

an input unit configured to acquire a first input related to a structure of a pre-processing substrate, a second input related to a required shape of a post-processing substrate, a third input related to a specification of a plasma processing device, and a fourth input related to a state of the plasma processing device;

a first determination unit configured to determine, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, the first machine learning model being trained in advance based on a plurality of experimental results and a plurality of simulation results;

a second determination unit configured to determine, based on the determined control parameters, the third input, and the fourth input, an operating condition of the plasma processing device using a second machine learning model, the operating condition including a cleaning condition and/or a coating condition for a chamber included in the plasma processing device, the second machine learning model being trained in advance based on a plurality of experimental results and a plurality of simulation results; and an output unit configured to output the determined control parameters and the determined operating condition.

10. The assistance device according to claim 9, wherein the first determination unit is configured to determine whether the predicted shape of the post-processing substrate matches the required shape.

11. The assistance device according to claim 10, wherein the first determination unit is configured to determine the plurality of control parameters in a case where the difference is within an allowable range.

12. The assistance device according to claim 9, wherein the plurality of control parameters further includes a fifth control parameter related to a temporal change of pressure in the plasma processing chamber.

13. The assistance device according to claim 9, wherein the operating condition is determined based on an amount of deposits deposited on an inner wall of the plasma processing chamber after processing the pre-processing substrate or a degree of damage to the inner wall of the plasma processing chamber after processing the pre-processing substrate.

14. An assistance method causing a computer to execute:

acquiring a first input related to a structure of a pre-processing substrate, a second input related to a required shape of a post-processing substrate, a third input related to a specification of a plasma processing device, and a fourth input related to a state of the plasma processing device;

determining, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, the first machine learning model being trained in advance based on a plurality of experimental results and a plurality of simulation results;

determining, based on the determined control parameters, the third input, and the fourth input, an operating condition of the plasma processing device using a second machine learning model, the operating condition including a cleaning condition and/or a coating condition for a chamber included in the plasma processing device, the second machine learning model being trained in advance based on a plurality of experimental results and a plurality of simulation results; and outputting the determined control parameters and the determined operating condition.

15. The assistance method according to claim 14, wherein the outputting includes outputting the determined control parameters, the predicted shape of the post-processing substrate, and the determined operating condition to the display device.

16. A non-transitory computer readable medium comprising computer executable program code configured to instruct at least one computer to perform the following process:

acquiring a first input related to a structure of a pre-processing substrate, a second input related to a required shape of a post-processing substrate, a third input related to a specification of a plasma processing device, and a fourth input related to a state of the plasma processing device;

determining, based on the first input, the second input, the third input, and the fourth input, a plurality of control parameters for processing the pre-processing substrate so that a predicted shape of the post-processing substrate conforms the required shape of the post-processing substrate, using a first machine learning model, each of the plurality of control parameters having a plurality of states that change over time, the first machine learning model being trained in advance based on a plurality of experimental results and a plurality of simulation results;

determining, based on the determined control parameters, the third input, and the fourth input, an operating condition of the plasma processing device using a second machine learning model, the operating condition including a cleaning condition and/or a coating condition for a chamber included in the plasma processing device, the second machine learning model being trained in advance based on a plurality of experimental results and a plurality of simulation results; and outputting the determined control parameters and the determined operating condition.

17. The non-transitory computer readable medium according to claim 16, wherein the process further includes determining whether the predicted shape of the post-processing substrate matches the required shape.

18. The non-transitory computer readable medium according to claim 17, wherein the process further includes determining the plurality of control parameters in a case where the difference is within an allowable range.

19. The non-transitory computer readable medium according to claim 16, wherein the plurality of control parameters further includes a fifth control parameter related to a temporal change of pressure in the plasma processing chamber.

20. The non-transitory computer readable medium according to claim 16, wherein the operating condition is determined based on an amount of deposits deposited on an inner wall of the plasma processing chamber after processing the pre-processing substrate or a degree of damage to the inner wall of the plasma processing chamber after processing the pre-processing substrate.

* * * * *